United States Patent
Suda et al.

(10) Patent No.: US 9,094,024 B2
(45) Date of Patent: Jul. 28, 2015

(54) SIGNAL PROCESSING APPARATUS AND METHOD, RECEIVING APPARATUS AND METHOD, AND, TRANSMITTING APPARATUS AND METHOD

(71) Applicant: Sony Corporation, Tokyo (JP)

(72) Inventors: Satoshi Suda, Tokyo (JP); Hideki Yokoshima, Kanagawa (JP); Yoshihisa Takaike, Tokyo (JP)

(73) Assignee: Sony Corporation, Tokyo (JP)

( * ) Notice: Subject to any disclaimer, the term of this patent is extended or adjusted under 35 U.S.C. 154(b) by 83 days.

(21) Appl. No.: 13/910,459

(22) Filed: Jun. 5, 2013

(65) Prior Publication Data

US 2014/0018021 A1 Jan. 16, 2014

(30) Foreign Application Priority Data

Jul. 12, 2012 (JP) ................................. 2012-156459

(51) Int. Cl.

| | |
|---|---|
| *H04B 1/26* | (2006.01) |
| *H04B 15/00* | (2006.01) |
| *H03L 7/085* | (2006.01) |
| *H04B 1/16* | (2006.01) |
| *H04B 1/04* | (2006.01) |
| *H03L 7/197* | (2006.01) |

(52) U.S. Cl.
CPC .............. *H03L 7/085* (2013.01); *H03L 7/1976* (2013.01); *H04B 1/04* (2013.01); *H04B 1/16* (2013.01)

(58) Field of Classification Search
CPC .............. H03B 7/00; H04B 1/30; H04B 1/28; H04B 1/405; H04B 1/406; H04B 1/40; H03D 7/1433
USPC ............. 455/75–78, 131, 230, 255–260, 313, 455/323, 334
See application file for complete search history.

(56) References Cited

U.S. PATENT DOCUMENTS

| | | | | |
|---|---|---|---|---|
| 6,151,369 | A | * | 11/2000 | Ohkubo et al. ................ 375/332 |
| 2002/0163389 | A1 | * | 11/2002 | Jun ................................ 331/1 A |

OTHER PUBLICATIONS

E. Zencir, et al., "A Low-power CMOS Mixer for Low-IF Receivers," IEEE Radio and Wireless Conference, 2002, pp. 157-160.

* cited by examiner

*Primary Examiner* — Nhan Le
(74) *Attorney, Agent, or Firm* — Fishman Stewart Yamaguchi PLLC

(57) ABSTRACT

There is provided a signal processing apparatus including an oscillating unit having a division ratio of an integer that performs oscillation at a predetermined oscillation frequency, a frequency transforming unit that transforms a frequency of a signal of a processing target using a signal of the oscillation frequency obtained by the oscillation of the oscillating unit, and a correcting unit that corrects an error of the frequency of the signal of the processing target transformed by the frequency transforming unit based on an error of the oscillation frequency.

8 Claims, 16 Drawing Sheets

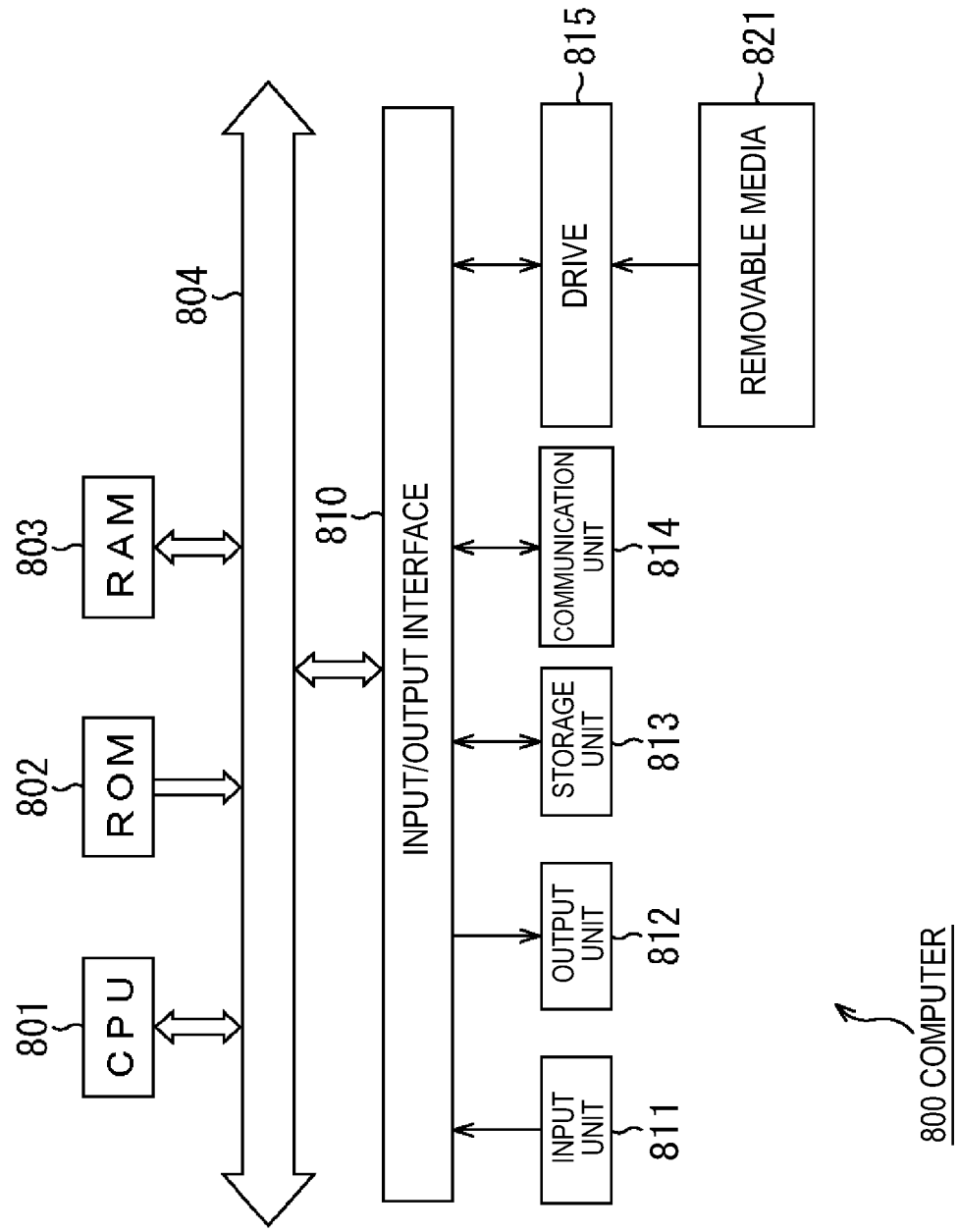

SIGNAL PROCESSING APPARATUS AND METHOD, RECEIVING APPARATUS AND METHOD, AND, TRANSMITTING APPARATUS AND METHOD

BACKGROUND

The present technology relates to a signal processing apparatus and method, a receiving apparatus and method, and a transmitting apparatus and method, and more particularly, to a signal processing apparatus and method, a receiving apparatus and method, and a transmitting apparatus and method which are capable of easily performing a high-accuracy frequency transform.

In the related art, in a receiving apparatus, a transmitting apparatus, or the like, a frequency transform has been performed on a reception signal or a transmission signal using a local oscillation frequency FLO to transform an RF signal into an IF signal or an IF signal into an RF signal (for example, see Ertan Zencir, Numan S. Dogan and Ercument Arvas, "*A Low-power CMOS Mixer for Low-IF Receivers*", IEEE Radio and Wireless Conference, 2002, pp. 157-160).

In recent years, with the development of communication technology, it is necessary to control a frequency transform with a high degree of accuracy (with a smaller step size).

As a local oscillating unit providing the local oscillation frequency FLO, for example, an integer-N type (hereinafter, also referred to as an "integer type) phase locked loop (PLL) having a division ratio of an integer has been used.

In order to further reduce a step size ΔFLO of the local oscillation frequency FLO, it is necessary to further reduce a step size ΔFVCO of an oscillation frequency FVCO of a voltage controlled oscillator (VCO) in the PLL, but in the integer-N type PLL, the oscillation frequency FVCO of the VCO can have only an integer multiple of a comparison frequency FREF of the PLL. In other words, in order to further reduce the step size ΔFVCO of the oscillation frequency FVCO of the VCO, it is necessary to reduce the comparison frequency FREF of the PLL.

However, the comparison frequency FREF is a parameter related to a loop characteristic of the PLL and is in a tradeoff relation with the performance. Therefore, when the integer-N type PLL is used as the local oscillating unit, it is likely to be difficult to sufficiently reduce the step size ΔFLO of the local oscillation frequency FLO, and to be difficult to control a frequency transform of a reception signal or a transmission signal with a sufficiently high degree of accuracy.

In this regard, a fractional-N type (hereinafter, also referred to as a "fractional type") PLL having a division ratio of a fraction has been considered for use as a local oscillating unit.

SUMMARY

However, in the fractional-N type PLL, a delta-sigma modulator (DSM) is used, and thus noise generally increases. In order to reduce the noise, it is necessary to use a low pass filter, and a configuration is likely to be more complicated than the integer-N type PLL.

It is desirable to more easily perform a high-accuracy frequency transform.

According to a first embodiment of the present disclosure, there is provided a signal processing apparatus including an oscillating unit having a division ratio of an integer that performs oscillation at a predetermined oscillation frequency, a frequency transforming unit that transforms a frequency of a signal of a processing target using a signal of the oscillation frequency obtained by the oscillation of the oscillating unit, and a correcting unit that corrects an error of the frequency of the signal of the processing target transformed by the frequency transforming unit based on an error of the oscillation frequency.

The correcting unit may correct the error of the frequency of the signal of the processing target that has been subjected to a frequency transform by the frequency transforming unit.

The signal processing apparatus may further include a channel selecting unit that selects a channel of the signal of the processing target that has been subjected to the frequency transform by the frequency transforming unit. The correcting unit may correct the error of the frequency of the signal of the processing target of the channel selected by the channel selecting unit.

The correcting unit may correct the error of the frequency of the signal of the processing target that is not subjected to a frequency transform by the frequency transforming unit.

The signal processing apparatus may further include a channel selecting unit that selects a channel of the signal of the processing target that is not subjected to a frequency transform by the frequency transforming unit. The correcting unit may correct the error of the frequency of the signal of the processing target before the channel is selected by the channel selecting unit.

The error of the oscillation frequency may be a difference between a desired value and an actual value of the oscillation frequency that occurs due to a control width of the oscillation frequency.

The error of the frequency after the signal of the processing target is transformed may be smaller than a control width of the oscillation frequency.

A control width of the oscillation frequency may be smaller than a channel width of the signal of the processing target.

The signal processing apparatus may further include a control unit that controls operations of the oscillating unit and the correcting unit.

The control unit may control at least the oscillation frequency of the oscillating unit and a correction amount of the correcting unit.

The control unit may inform the correcting unit of the correction amount according to a format of the signal of the processing target.

The oscillating unit may include a voltage controlled oscillating unit that controls an output frequency according to an input voltage, a dividing unit that divides the output frequency of the voltage controlled oscillating unit at a division ratio of an integer, and a phase comparing unit that converts a phase difference between an input signal of the oscillating unit and an output signal of the dividing unit into a voltage, and supplies the voltage to the voltage controlled oscillating unit. The voltage controlled oscillating unit may control a frequency of the output signal of the oscillating unit based on the output voltage of the phase comparing unit, and the control unit may calculate the correction amount based on a step size of the output frequency of the voltage controlled oscillating unit and inform the correcting unit of the calculated correction amount.

The oscillating unit may include a voltage controlled oscillating unit that controls an output frequency according to an input voltage, a dividing unit that divides the output frequency of the voltage controlled oscillating unit at a division ratio of an integer, and a phase comparing unit that converts a phase difference between an input signal of the oscillating unit and an output signal of the dividing unit into a voltage, and supplies the voltage to the voltage controlled oscillating unit. The voltage controlled oscillating unit may control a frequency of the output signal of the oscillating unit based on the output voltage of the phase comparing unit, and the control unit may calculate the correction amount based on a step size of the division ratio of the dividing unit and inform the correcting unit of the calculated correction amount.

According to the first embodiment of the present disclosure, there is provided a signal processing method performed by a signal processing apparatus, the signal processing method including performing oscillation at a predetermined oscillation frequency using a division ratio of an integer, transforming a frequency of a signal of a processing target using a signal of the oscillation frequency obtained by the oscillation, and correcting an error of the frequency of the signal of the processing target transformed by a frequency transform based on an error of the oscillation frequency.

According to a second embodiment of the present disclosure, there is provided a receiving apparatus including a receiving unit that receives a signal, an oscillating unit having a division ratio of an integer that performs oscillation at a predetermined oscillation frequency, a frequency transforming unit that transforms a frequency of an RF signal of the signal received by the receiving unit using a signal of the oscillation frequency obtained by the oscillation of the oscillating unit, and generates an IF signal, and a correcting unit that corrects an error of a frequency of the IF signal based on an error of the oscillation frequency of the IF signal generated by the frequency transforming unit.

The receiving apparatus may further include a control unit that controls at least the oscillation frequency of the oscillating unit and a correction amount of the correcting unit.

According to the second embodiment of the present disclosure, there is provided a receiving method performed by a receiving apparatus, the receiving method including receiving a signal, performing oscillation at a predetermined oscillation frequency using a division ratio of an integer, converting a frequency of an RF signal of the received signal using a signal of the oscillation frequency obtained by the oscillation, and generating an IF signal, and correcting an error of a frequency of the IF signal based on an error of the oscillation frequency of the generated IF signal.

According to a third embodiment of the present disclosure, there is provided a transmitting apparatus including an oscillating unit having a division ratio of an integer that performs oscillation at a predetermined oscillation frequency, a correcting unit that corrects an error of a frequency of an IF signal based on an error of the oscillation frequency of the IF signal, a frequency transforming unit that transforms a frequency of the IF signal of which the error is corrected by the correcting unit using a signal of the oscillation frequency obtained by the oscillation of the oscillating unit, and generates an RF signal, and a transmitting unit that transmits the RF signal generated by the frequency transforming unit.

The transmitting apparatus may further include a control unit that controls at least the oscillation frequency of the oscillating unit and a correction amount of the correcting unit.

According to the third embodiment of the present disclosure, there is provided a transmitting method performed by a transmitting apparatus, the transmitting method including performing oscillation at a predetermined oscillation frequency using a division ratio of an integer, correcting an error of a frequency of an IF signal based on an error of the oscillation frequency of the IF signal, transforming a frequency of the IF signal of which the error is corrected using a signal of the oscillation frequency obtained by the oscillation, and generating an RF signal, and transmitting the generated RF signal.

According to the first embodiment of the present technology, oscillation is performed at a predetermined oscillation frequency using a division ratio of an integer, a frequency of a signal of a processing target is transformed using a signal of the oscillation frequency obtained by the oscillation, and an error of the frequency of the processing target transformed by a frequency transform that is based on an error of the oscillation frequency of the signal is corrected.

According to the second embodiment of the present technology, a signal is received, oscillation is performed at a predetermined oscillation frequency using a division ratio of an integer, a frequency of an RF signal of the received signal is transformed using a signal of the oscillation frequency obtained by the oscillation to generate an IF signal, and an error of a frequency of the IF signal based on an error of the oscillation frequency is corrected on the generated IF signal.

According to the third embodiment of the present technology, oscillation is performed at a predetermined oscillation frequency using a division ratio of an integer, an error of a frequency of an IF signal based on an error of the oscillation frequency is corrected on the IF signal, a frequency of the IF signal on which the error is corrected is transformed using a signal of the oscillation frequency obtained by oscillation to generate an RF signal, and the generated RF signal is transmitted.

According to the embodiments of the present technology described above, a signal can be processed. Particularly, a high-accuracy frequency transform can be more easily performed.

BRIEF DESCRIPTION OF THE DRAWINGS

FIG. 16 is a block diagram illustrating a main configuration example of a computer.

DETAILED DESCRIPTION OF THE EMBODIMENT(S)

Figure 1:
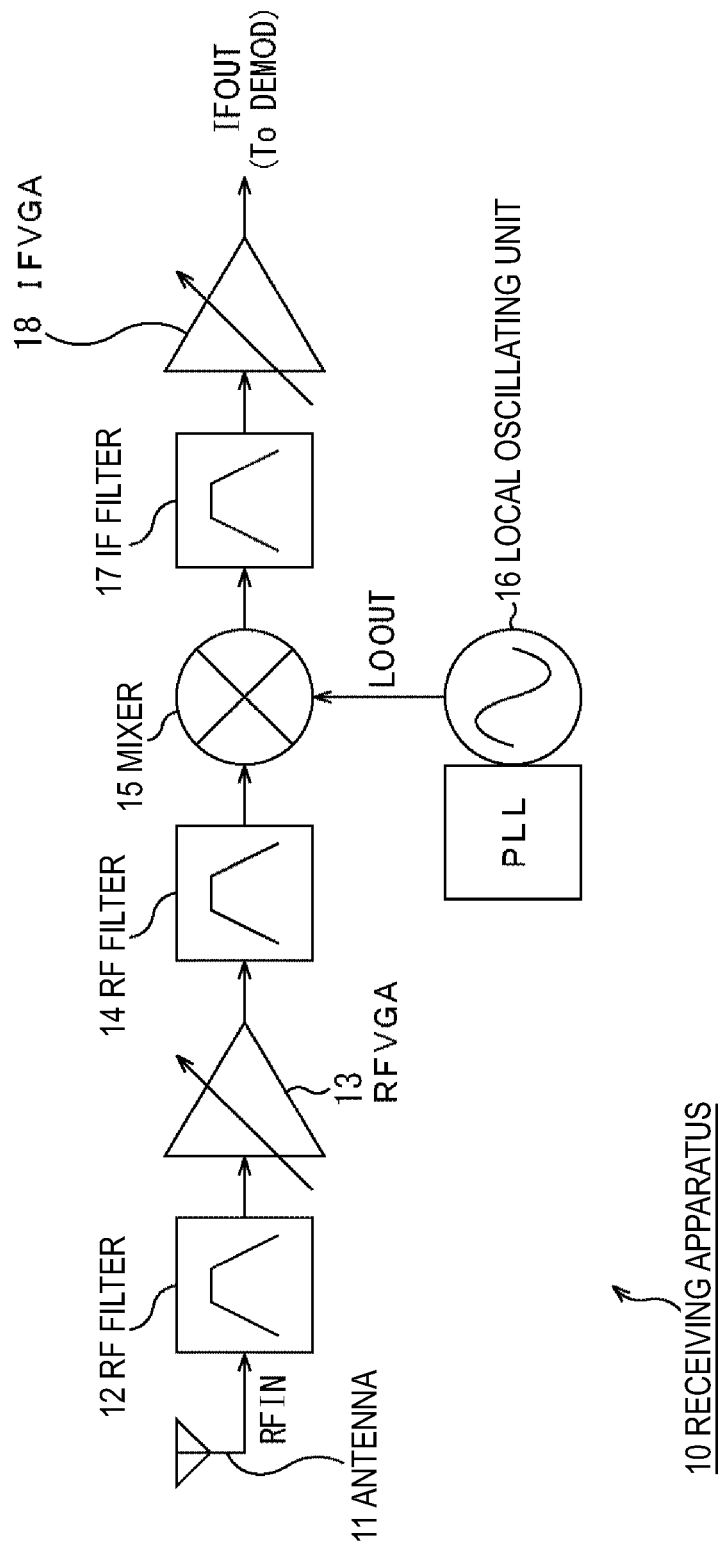
FIG. 1 is a block diagram illustrating a main configuration example of a receiving apparatus.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, modes (hereinafter referred to as "embodiments") for carrying out the present disclosure will be described. The description will proceed in the following order.

1. First embodiment (receiving apparatus)
2. Second embodiment (receiving apparatus)
3. Third embodiment (transmitting apparatus)
4. Fourth embodiment (transmitting apparatus)
5. Fifth embodiment (display device)
6. Sixth embodiment (communication device)
7. Seventh embodiment (computer)

1. First Embodiment

[1-1. Receiving Apparatus]

In the past, in a receiving apparatus, a frequency transform is performed on a reception signal using a local oscillation frequency FLO to transform an RF signal into an IF signal.

FIG. 1 is a block diagram illustrating a main configuration example of a receiving apparatus. A receiving apparatus 10 illustrated in FIG. 1 is a communication device having a receiving function of receiving a radio signal transmitted from a transmitting apparatus (not illustrated).

As illustrated in FIG. 1, the receiving apparatus 10 includes an antenna 11, an RF filter 12, an RFVGA 13, an RF filter 14, a mixer 15, a local oscillating unit 16, an IF filter 17, and an IFVGA 18. The receiving apparatus 10 receives a radio signal through the antenna, converts the radio signal into an electric signal (RF signal), performs a frequency transform on the RF signal to generate an IF signal, extracts a desired frequency component, and outputs the extracted frequency component.

The RF filter 12 performs a filter process on the RF signal (RFIN), supplied from the antenna 11, corresponding to the radio signal received by the antenna 11, and extracts a predetermined frequency band component. The RF filter 12 supplies the extracted predetermined frequency band component (RF signal) to the RFVGA 13.

The RFVGA 13 is a gain amplifier that amplifies the RF signal supplied from the RF filter 12 in order to stabilize a signal level. The RFVGA 13 supplies the amplified RF signal to the RF filter 14.

The RF filter 14 is the same filter as the RF filter 12, and performs a filter process on the RF signal supplied from the RFVGA 13 and extracts a predetermined frequency band component. The RF filter 14 supplies the extracted predetermined frequency band component (RF signal) to the mixer 15.

The mixer 15 converts a frequency FRF (hereinafter, also referred to as an "RF frequency FRF") of the RF signal supplied from the RF filter 14 using a frequency (a local oscillation frequency FLO (hereinafter, also referred to as an "LO frequency FLO")) of a local signal (hereinafter, also referred to as an "LO signal") supplied from the local oscillating unit 16, and generates an IF signal of a frequency FIF (hereinafter, also referred to as an "IF frequency FIF"). The mixer 15 supplies the generated IF signal to the IF filter 17.

The local oscillating unit 16 generates an LO signal (clock) of a predetermined frequency (the LO frequency FLO), and supplies the LO signal to the mixer 15 (LOOUT). The local oscillating unit 16 includes a PLL that outputs a signal having the LO frequency FLO, and supplies a signal generated in the PLL to the mixer 15 as the LO signal. The mixer 15 performs a frequency transform (down conversion) to transform the RF frequency FRF into the IF frequency FIF by multiplying the RF signal by the LO signal.

The IF filter 17 performs a filter process on the IF signal supplied from the mixer 15, extracts a desired frequency band component, and selects a desired channel. The IF filter 17 supplies the IF signal of the selected channel to the IFVGA 18.

The IFVGA 18 is a gain amplifier that amplifies the IF signal supplied from the IF filter 17 in order to stabilize a signal level. The IFVGA 18 supplies the amplified IF signal to the outside of the receiving apparatus 10 (for example, a processing unit of a subsequent stage such as a demodulation processing unit (DEMOD) that demodulates a modulated IF signal) (IFOUT).

In the receiving apparatus 10, the IF frequency FIF is decided using the LO frequency FLO and the RF frequency FRF as in the following Equation (1):

$$FIF = FLO - FRF \quad (1)$$

In this case, in order to obtain the IF frequency FIF of a desired value, it is necessary to set the LO frequency FLO as in the following Equation (2):

$$FLO = FRF + FIF \quad (2)$$

Of course, in Equation (1), FIF can be obtained by an addition result of FLO and FRF. In any case, when a frequency variable step size of the IF frequency FIF is represented by $\Delta FIF$, a frequency variable step size of the RF frequency FRF is represented by $\Delta FRF$, and a frequency variable step size of the LO frequency FLO is represented by $\Delta FLO$, in order to tune the IF frequency FIF to a desired frequency, $\Delta FRF$ and $\Delta FLO$ have to satisfy relations of the following Equations (3) and (4), respectively.

$$\Delta FLO \leq \Delta FRF \quad (3)$$

$$\Delta FLO \leq \Delta FIF \quad (4)$$

In other words, $\Delta FLO$ is restricted by $\Delta FRF$ and $\Delta FIF$. In recent years, with the development of communication technology, it is necessary to change the IF frequency FIF with a high degree of accuracy (with a smaller step size). To this end, it is also necessary to reduce $\Delta FLO$ as in Equation (4).

[1-2. Local Oscillating Unit]

Figure 2:
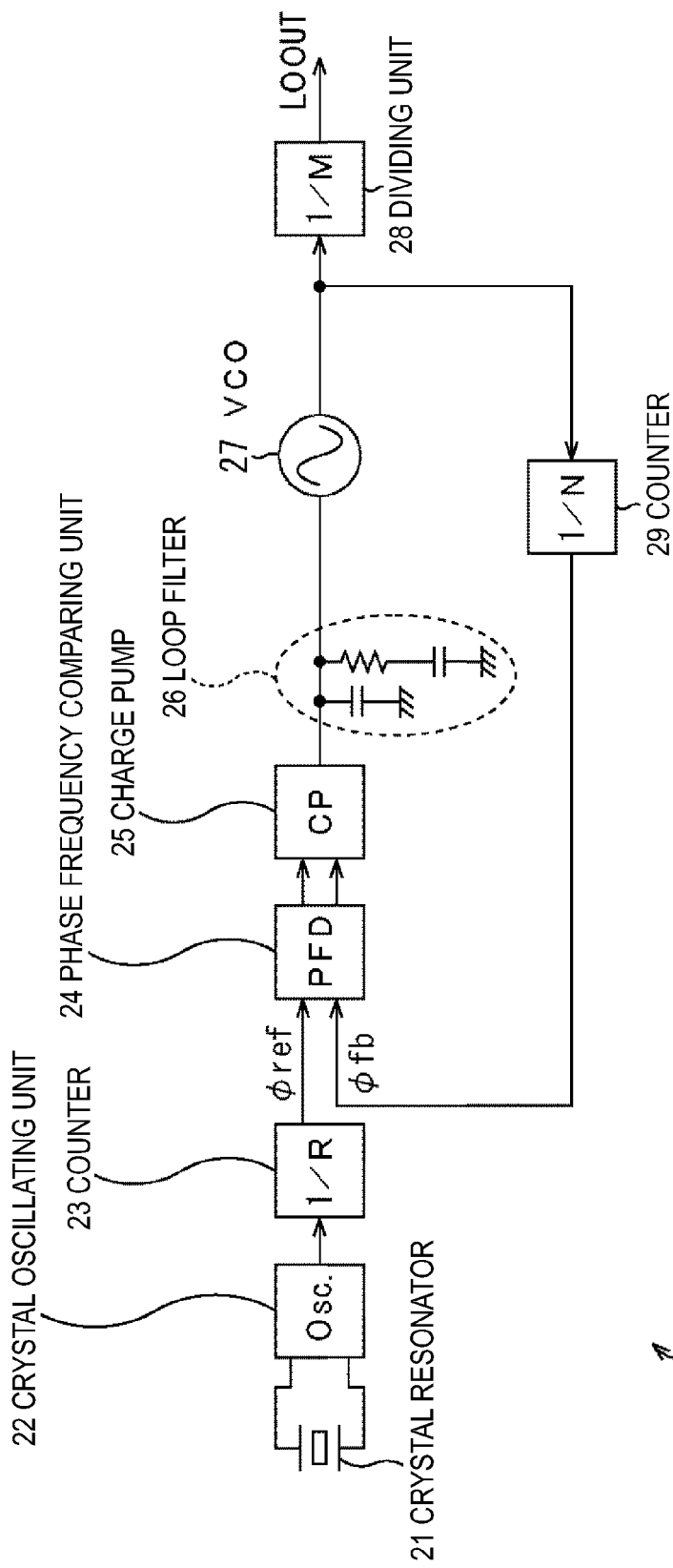
FIG. 2 is a block diagram illustrating a main configuration example of a local oscillating unit.

FIG. 2 is a block diagram illustrating a main configuration example of the local oscillating unit 16 of FIG. 1.

The local oscillating unit 16 illustrated in FIG. 2 includes an integer-N type (which is also referred to as an "integer type") PLL having a division ratio of an integer. As illustrated in FIG. 2, the local oscillating unit 16 includes a crystal resonator 21, a crystal oscillating unit 22, a counter 23, a phase frequency comparing unit 24, a charge pump 25, a loop filter 26, a voltage controlled oscillator (VCO) 27, a dividing unit 28, and a counter 29.

The crystal resonator 21 is configured such that a crystal resonator in which a crystal piece (crystal blank) that is a piezoelectric substance is interposed between two electrodes is placed in a holder. The crystal oscillating unit 22 causes the crystal resonator 21 to oscillate at an oscillation frequency unique to crystal by applying a voltage to the crystal resonator 21, and amplifies an obtained signal. The counter (1/R) 23 divides the amplified signal at a division ratio R, generates a signal having the comparison frequency FREF, and supplies the generated signal to the phase frequency comparing unit 24.

The phase frequency comparing unit (phase frequency detector (PFD)) 24 compares a phase of the signal supplied from the counter 23 with a phase of the signal supplied from the counter 29, converts a phase difference between the signals into a voltage, and supplies the voltage to the charge pump 25.

The charge pump (charge pump (CP)) 25 increases the voltage supplied from the phase frequency comparing unit 24. The charge pump 25 supplies the increased voltage to the VCO 27.

The loop filter 26 is a feedback loop filter, and for example, a low pass filter is used. In order to suppress oscillation that is likely to occur in a configuration having feedback, the loop filter 26 suppresses an unnecessary short period variation in an input voltage of the VCO 27 controlled by the phase frequency comparing unit 24 or the charge pump 25.

The VCO 27 is an oscillator that controls an output frequency according to an input voltage. The VCO 27 supplies the signal having the oscillation frequency FVCO to the dividing unit 28 and the counter 29.

The dividing unit (1/M) 28 divides the signal having the oscillation frequency FVCO supplied from the VCO 27 at a division ratio M. The dividing unit 28 supplies the divided signal to the mixer 15 as the LO signal (LOOUT).

The counter (1/N) 29 divides the signal having the oscillation frequency FVCO supplied from the VCO 27 at a division ratio N. The counter 29 supplies the divided signal to the phase frequency comparing unit 24.

When the integer-N type PLL is used as the local oscillating unit 16, the LO frequency FLO may be obtained using the oscillation frequency FVCO of the VCO 27 as in the following Equation (5):

$$FLO = FVCO/M \quad (5) \text{ (here, M is an integer)}.$$

Therefore, when the frequency variable step size of the oscillation frequency FVCO is represented by ΔFVCO, in order to reduce ΔFLO, it is also necessary to reduce ΔFVCO.

The oscillation frequency FVCO of the VCO 27 may be obtained using the comparison frequency FREF as in the following Equation (6).

$$FVCO = FREF \times N \quad (6)$$

In other words, the oscillation frequency FVCO can have only a value of an integer multiple (an N multiple) of the comparison frequency FREF. Therefore, in order to further reduce ΔFVCO, it is also necessary to further reduce the comparison frequency FREF.

However, the comparison frequency FREF is a parameter related to a loop characteristic of the PLL (the local oscillating unit 16) and is in a tradeoff relation with the performance. For this reason, when the integer-N type PLL is used as the local oscillating unit 16, it is likely to be difficult to reduce ΔFVCO and ΔFLO, and to be difficult to control the oscillation frequency FVCO or the LO frequency FLO with a sufficiently high degree of accuracy (with a sufficiently small step size).

[1-3. Local Oscillating Unit]

In this regard, use of a fractional-N type (which is also referred to as a "fractional type) PLL capable of having a fraction as a division ratio as the local oscillating unit 16 is considered.

Figure 3:
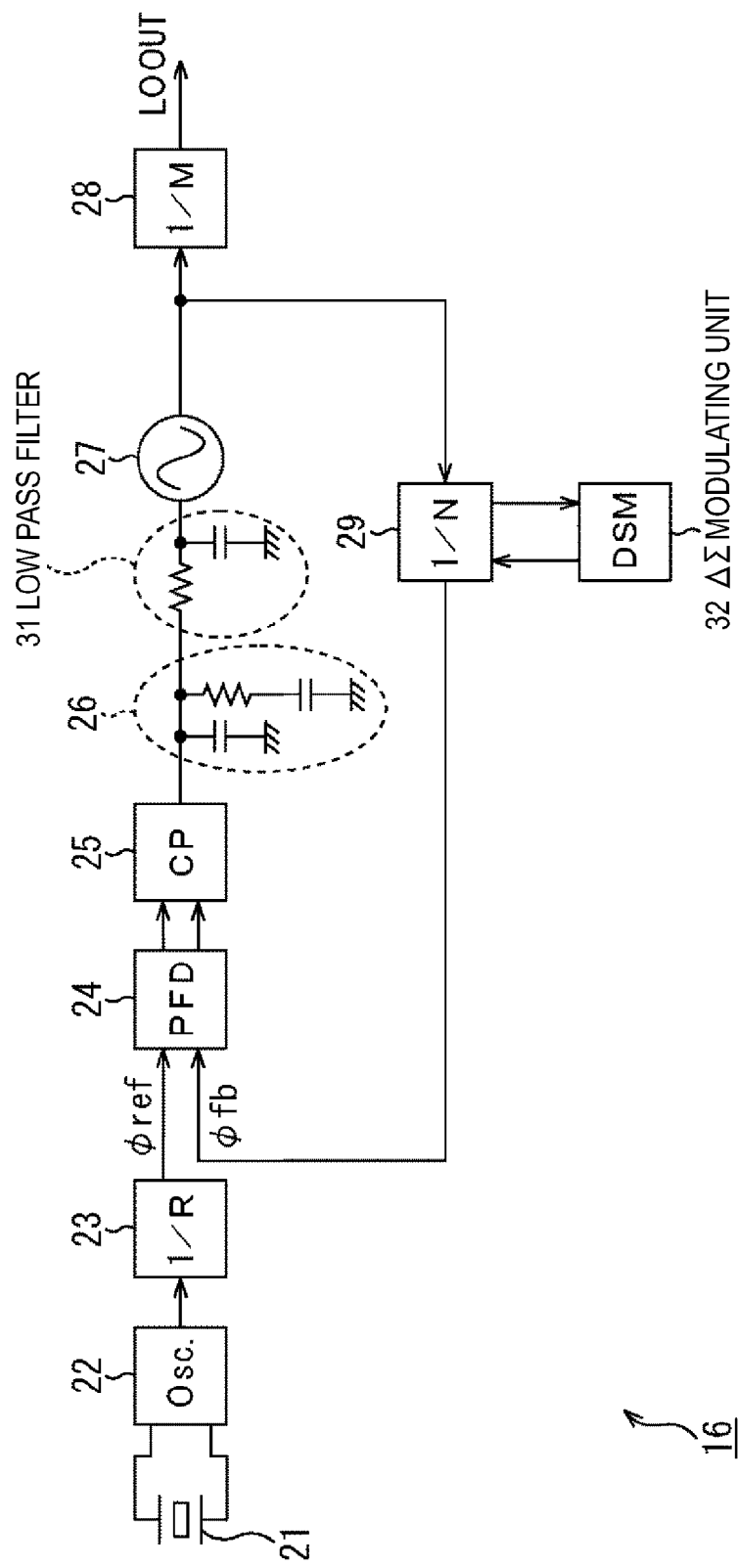
FIG. 3 is a block diagram illustrating a main configuration example of a local oscillating unit.

FIG. 3 is a block diagram illustrating another configuration example of the local oscillating unit 16 of FIG. 1.

As illustrated in FIG. 3, in this case, the local oscillating unit 16 includes a fractional-N type PLL capable of having a fraction as a division ratio. As illustrated in FIG. 3, in this case, the local oscillating unit 16 further includes a low pass filter 31 and a ΔΣ modulating unit (delta-sigma modulator (DSM)) in addition to the configuration of the example illustrated in FIG. 2.

The ΔΣ modulating unit 32 shapes the power spectrum density distribution of a quantization error sampled at a high speed, and improves a dynamic range of a pass band.

The low pass filter 31 removes a noise component, which increases when the ΔΣ modulating unit 32 is used, from the input voltage of the VCO 27.

As described above, as the ΔΣ modulating unit 32 is applied, a fraction can be practically used as a value of the division ratio N of the counter 29. Therefore, as the fractional-N type PLL is applied to the local oscillating unit 16, ΔFVCO can be reduced to be smaller than in the example of FIG. 2.

However, as illustrated in FIG. 3, in the fractional-N type PLL, the low pass filter 31 and the ΔΣ modulating unit 32 are necessary in addition to the configuration of the integer-N type PLL. As described above, the configuration of the local oscillating unit 16 is likely to be more complicated. For this reason, the circuit size increases, and thus there are risks of an occupation area increasing, a processing delay increasing, and power consumption increasing. As a result, it is likely to be difficult to implement a design for downsizing, low power consumption, or the like. Thus, the cost is likely to increase in all aspects such as development, manufacturing, and operation.

[1-4. Frequency Correction]

In this regard, an error occurring at the IF frequency FIF is further corrected using the integer-N type PLL instead of the fractional-N type PLL. In other words, as described above, when the integer-N type PLL is used, the control accuracy of the IF frequency FIF is likely to be lower (larger in the step size) than when the fractional-N type PLL is used, but an error of the IF frequency FIF occurring due to a difference in the accuracy (step size), that is, an error of the LO frequency FLO, is corrected.

For example, a signal processing apparatus that performs a frequency transform on a signal is configured to include an oscillating unit having a division ratio of an integer that performs oscillation at a predetermined oscillation frequency, a frequency transforming unit that transforms a frequency of a signal of a processing target using a signal having the oscillation frequency obtained by oscillation of the oscillating unit, and a correcting unit that corrects an error of the frequency of the signal of the processing target transformed by the frequency transforming unit that is based on the error of the oscillation frequency.

Thus, it is possible to implement a high-accuracy frequency transform while using an oscillating unit of a simple configuration having a division ratio of an integer as a configuration of a signal processing apparatus. In other words, the signal processing apparatus can simplify the configuration while implementing frequency control of high accuracy (small step size). In other words, the signal processing apparatus can more easily perform a high-accuracy frequency transform. Thus, as the signal processing apparatus controls a frequency transform with a high degree of accuracy, an increase in the circuit size, a processing delay, power consumption, or the like can be suppressed. Therefore, the signal processing apparatus can be easily reduced in size and power consumption, and an increase in the cost in all aspects such as development, manufacturing, and operation can be suppressed.

Further, the correcting unit may be configured to correct an error of frequency of the signal of the processing target that has been subjected to the frequency transform by the frequency transforming unit. For example, when an IF signal is generated by performing a frequency transform on an RF signal, the correcting unit may be configured to correct the frequency of the transformed IF signal. As a result, for example, when an IF signal is output to a subsequent processing unit as in the receiving apparatus, the frequency of the IF signal of the purpose can be controlled with a high degree of accuracy.

Further, a channel selecting unit that selects a channel of the signal of the processing target that has been subjected to a frequency transform by the frequency transforming unit may be further provided. The correcting unit may be configured to correct an error of a frequency of the signal of the processing target of the channel selected by the channel selecting unit. As a result, frequency correction can be performed only on a frequency component of a desired band.

In addition, the correcting unit may be configured to correct an error of a frequency of the signal of the processing target that is not subjected to a frequency transform by the frequency transforming unit. For example, when an RF signal is generated by performing a frequency transform on an IF signal, the correcting unit may be configured to correct a frequency of an IF signal that is not transformed. As a result, for example, even when an IF signal is transformed into an RF signal and the RF signal is output as in the transmitting apparatus, the frequency of the IF signal can be controlled with a high degree of accuracy.

Further, a channel selecting unit that selects a channel of the signal of the processing target that is not subjected to a frequency transform by the frequency transforming unit may be further provided. The correcting unit may be configured to correct an error of a frequency of the signal of the processing target before the channel is selected by the channel selecting unit. As a result, a frequency of an IF signal can be corrected in advance by an error occurring due to a frequency transform.

Further, a difference between a desired value and an actual value of an oscillation frequency which occurs due to a control width (step size) of an oscillation frequency may be used as an error of an oscillation frequency. As a result, a frequency transform can be performed with a high degree of accuracy without further reducing the control width of the oscillation frequency.

An error of a frequency after a signal of a processing target is transformed may be smaller than the control width of the oscillation frequency. As a result, a high-accuracy frequency transform can be more easily implemented.

The control width of the oscillation frequency may be smaller than a channel width of a signal of a processing target. As a result, a high-accuracy frequency transform can be more easily implemented.

A control unit that controls operations of the oscillating unit and the correcting unit may be further provided. For example, the control unit is configured to perform processing related to correction. As a result, an increase in the circuit size for frequency correction can be suppressed, and a high-accuracy frequency transform can be more easily implemented.

The control unit may be configured to control at least an oscillation frequency of the oscillating unit and a correction amount of the correcting unit. As the control unit performs control as described above, a high-accuracy frequency transform can be more easily implemented.

The control unit may be configured to inform the correcting unit of a correction amount according to a format of a signal of a processing target. For example, the control unit may set a correction amount in advance for each format of a signal of a processing target, select a correction amount according to the format, and inform the correcting unit of the selected correction amount. As a result, a correction amount deciding process is more easily performed.

The oscillating unit may include a voltage controlled oscillating unit that controls an output frequency based on an input voltage, a dividing unit that divides an output frequency of the voltage controlled oscillating unit at a division ratio of an integer, and a phase comparing unit that converts a phase difference between an input signal of the oscillating unit and an output signal of the dividing unit into a voltage, and supplies the voltage to the voltage controlled oscillating unit, the voltage controlled oscillating unit may control the frequency of the output signal of the oscillating unit based on the output voltage of the phase comparing unit, and the control unit may calculate a correction amount based on the step size of the output frequency of the voltage controlled oscillating unit and inform the correcting unit of the calculated correction amount. As a result, a high-accuracy frequency transform can be more easily implemented based on the step size of the output frequency of the voltage controlled oscillating unit.

The oscillating unit may include a voltage controlled oscillating unit that controls an output frequency based on an input voltage, a dividing unit that divides the output frequency of the voltage controlled oscillating unit at a division ratio of an integer, and a phase comparing unit that converts a phase difference between the input signal of the oscillating unit and the output signal of the dividing unit into a voltage and supplies the voltage to the voltage controlled oscillating unit, the voltage controlled oscillating unit may control the frequency of the output signal of the oscillating unit based on the output voltage of the phase comparing unit, and the control unit may calculate a correction amount based on the step size of the division ratio of the dividing unit and inform the correcting unit of the calculated correction amount. As a result, a high-accuracy frequency transform can be more easily implemented based on the step size of the division ratio of the dividing unit.

All or a part of the present technology may be implemented by software.

[1-5. Frequency Correction in Receiving Apparatus]

The present technology may be implemented not only as the signal processing apparatus but also as the receiving apparatus performing the above-described signal processing. For example, the receiving apparatus may include a receiving unit that receives a signal, an oscillating unit having a division ratio of an integer that performs oscillation at a predetermined oscillation frequency, a frequency transforming unit that converts the frequency of an RF signal of the signal received by the receiving unit using the signal having the oscillation frequency obtained by oscillation of the oscillating unit to generate an IF signal, and a correcting unit that corrects an error of the frequency of the IF signal based on an error of the oscillation frequency of the IF signal generated by the frequency transforming unit.

As a result, a high-accuracy frequency transform can be implemented while using an oscillating unit of a simple configuration having a division ratio of an integer as a configuration of a receiving apparatus. In other words, the receiving apparatus can implement frequency control of the high accuracy (small step size), and the configuration can be simplified. In other words, the receiving apparatus can more easily implement a high-accuracy frequency transform. Thus, as the receiving apparatus controls a frequency transform with a high degree of accuracy, an increase in the circuit size, a processing delay, power consumption, or the like can be suppressed. Therefore, the receiving apparatus can be easily reduced in size and power consumption, and an increase in the cost in all aspects such as development, manufacturing, and operation can be suppressed.

Further, a control unit that controls at least an oscillation frequency of the oscillating unit and a correction amount of the correcting unit may be further provided. For example, the control unit is configured to perform processing related to correction. As a result, an increase in the circuit size for frequency correction can be suppressed, and a high-accuracy frequency transform can be more easily implemented.

All or a part of the present technology may be implemented by software.

[1-6. Receiving Apparatus]

Figure 4:
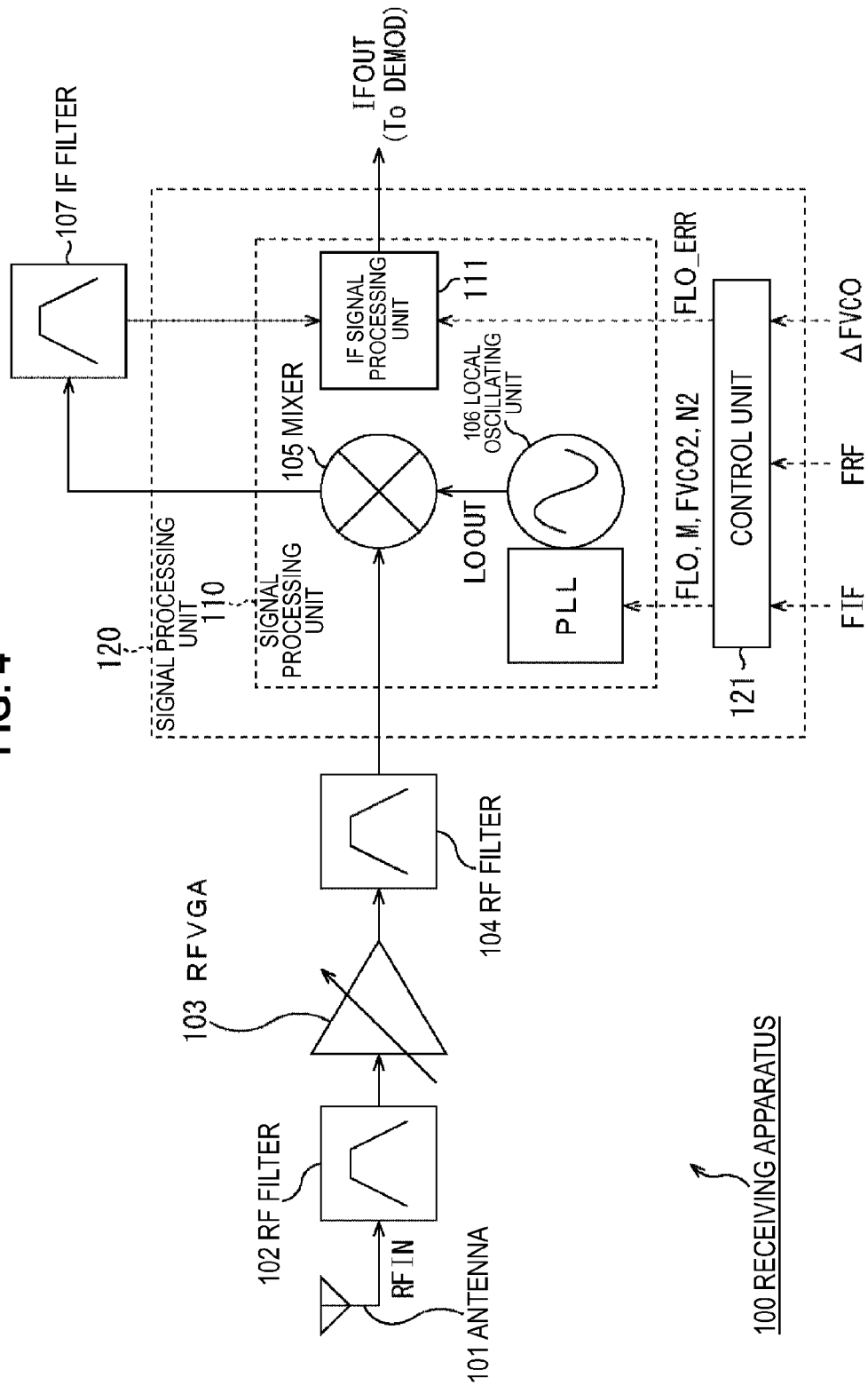
FIG. 4 is a block diagram illustrating a main configuration example of a receiving apparatus.

A more concrete example will be described. FIG. 4 is a block diagram illustrating a main configuration example of the receiving apparatus.

The receiving apparatus 100 illustrated in FIG. 4 is not only a receiving apparatus to which the present technology is applied but also a communication device having a receiving function of receiving a radio signal transmitted from a transmitting apparatus (not shown).

As illustrated in FIG. 4, the receiving apparatus 100 includes an antenna 101, an RF filter 102, an RFVGA 103, an RF filter 104, a mixer 105, a local oscillating unit 106, an IF filter 107, and an IF signal processing unit 111. The receiving apparatus 100 receives a radio signal through the antenna 101, converts the radio signal into an electric signal (RF signal), performs a frequency transform on the RF signal to generate an IF signal, extracts a desired frequency component, and outputs the extracted frequency component.

The RF filter 102 performs a filter process on the RF signal (RFIN), supplied from the antenna 101, corresponding to the radio signal received by the antenna 101, and extracts a predetermined frequency band component. The RF filter 102 supplies the extracted predetermined frequency band component (RF signal) to the RFVGA 103.

The RFVGA 103 is a gain amplifier that amplifies the RF signal supplied from the RF filter 102 in order to stabilize a signal level. The RFVGA 103 supplies the amplified RF signal to the RF filter 104.

The RF filter 104 is the same filter as the RF filter 102, and performs a filter process on the RF signal supplied from the RFVGA 103 and extracts a predetermined frequency band component. The RF filter 104 supplies the extracted predetermined frequency band component (RF signal) to the mixer 105.

The mixer 105 converts the RF frequency FRF of the RF signal supplied from the RF filter 104 using an LO frequency FLO of the LO signal supplied from the local oscillating unit 106 to generate an IF signal of the IF frequency FIF. The mixer 105 supplies the generated IF signal to the IF filter 107.

The local oscillating unit 106 generates a LO signal (clock) of a predetermined frequency (the LO frequency FLO), and supplies the LO signal to the mixer 105 (LOOUT). The local oscillating unit 106 includes a PLL that outputs the signal of the LO frequency FLO, for example, an integer-N type PLL illustrated in FIG. 2. The local oscillating unit 106 supplies a signal generated in the PLL to the mixer 105 as the LO signal. The mixer 105 performs a frequency transform (down conversion) to transform the RF frequency FRF into the IF frequency FIF by multiplying the RF signal by the LO signal.

The IF filter 107 performs a filter process on the IF signal supplied from the mixer 105, extracts a desired frequency band component, and selects a desired channel. The IF filter 107 supplies the IF signal of the selected channel to the IF signal processing unit 111.

The IF signal processing unit 111 performs error correction on the IF signal supplied from the IF filter 107.

As described above, the integer-N type PLL is used as the local oscillating unit 106. The division ratio N of the integer-N type PLL is an integer as described above. Therefore, it is difficult to sufficiently reduce $\Delta$FVCO that is a step size of the VCO 27 of the PLL. For this reason, it is difficult to sufficient reduce the control width (step size) $\Delta$FLO of the LO frequency FLO.

Thus, an error is likely to occur in the LO frequency FLO. In other words, for the same reason, an error is likely to occur in the IF frequency FIF that has been subjected to a frequency transform.

In this regard, as $\Delta$FVCO is not sufficiently small, the IF signal processing unit 111 corrects an error FLO_ERR of the LO frequency FLO. For example, the IF signal processing unit 111 performs this correction on the IF signal output from the IF filter 107. Further, the IF signal processing unit 111 can perform this correction on the LO signal to be input the mixer 105, but as this correction is performed on a finally obtained IF signal, that is, the IF signal of the channel selected by the IF filter 107, influence of this correction on an unnecessary component can be suppressed.

This correction will be described. For example, when a frequency transform is performed at a sufficient degree of accuracy (with a sufficiently small step size), if a desired LO frequency is represented by FLO and a LO frequency rounded using $\Delta$FVCO is represented by FLO2, the error FLO_ERR of the LO frequency FLO2 on the LO frequency FLO can be expressed as in the following Equation (7):

$$FLO2 = FLO + FLO\_ERR \quad (7)$$

A desired IF frequency FIF may be obtained based on Equations (1) and (7) as in the following Equation (8):

$$FIF = (FLO2 - FRF) - FLO\_ERR \quad (8)$$

In other words, the IF signal processing unit 111 preferably performs correction such that the error FLO_ERR is subtracted from the frequency (FLO2−FRF) of the rounded IF signal supplied from the IF filter 107. In other words, when FLO_ERR is already known, the IF signal processing unit 111 can perform the correction without control from the outside (the predetermined frequency FLO_ERR is merely subtracted from the IF frequency FIF).

As the IF signal processing unit 111 performs the correction, the receiving apparatus 100 can obtain an IF signal of a desired IF frequency FIF even when the step size $\Delta$FVCO of the oscillation frequency FVCO of the VCO 27 is not sufficiently small. In other words, even when $\Delta$FLO does not satisfy Equations (3) and (4) (when $\Delta$FRF<$\Delta$FLO), the receiving apparatus 100 can obtain an IF signal of a desired IF frequency FIF obtained by performing a frequency transform with a sufficiently high degree of accuracy (with a sufficiently small step size).

In other words, the receiving apparatus 100 can obtain an IF signal of a desired IF frequency FIF by the simple configuration in which the integer-N type PLL is used as the local oscillating unit 106. In other words, the receiving apparatus 100 can more easily implement a high-accuracy frequency transform.

As a result, as the receiving apparatus 100 controls a frequency transform with a high degree of accuracy, an increase in the circuit size, a processing delay, power consumption, or the like can be suppressed. Therefore, the receiving apparatus 100 can be easily reduced in the size and the power consumption, and an increase in the cost in all aspects such as development, manufacturing, and operation can be suppressed.

As illustrated in FIG. 4, the mixer 105, the local oscillating unit 106, and the IF signal processing unit 111 may be configured as a single signal processing unit 110. Of course, the IF filter 107 may be added to the configuration of the signal processing unit 110. Further, the signal processing unit 110 may be configured as a single apparatus (a signal processing apparatus) independently of the other configurations.

In this case, the signal processing unit 110 (the signal processing apparatus) can have the same effects as in the receiving apparatus 100.

Further, when a plurality of values can be a candidate of the error FLO_ERR, it is necessary to decide the error FLO_ERR (that is, a correction amount of the IF frequency FIF) based on certain information. In the example of FIG. 4, the receiving apparatus 100 includes a control unit 121.

The control unit 121 controls operations of the local oscillating unit 106 and the IF signal processing unit 111. More specifically, the control unit 121 controls an operation of the local oscillating unit 106 by supplying the desired LO frequency FLO, the division ratio M, the rounded oscillation frequency FVCO2, and the rounded division ratio N2 to the local oscillating unit 106. Further, the control unit 121 controls an operation of the IF signal processing unit 111 by supplying the error FLO_ERR to the IF signal processing unit 111.

Further, the control unit 121 decides the values of the parameters. A decision method is arbitrary.

For example, the signal processing unit 110 may be configured to decide the values of the parameters, for example, based on a format of a signal that is to be subjected to a frequency transform (that is, a signal received by the receiving apparatus 100). For example, the control unit 121 may hold table information in which a value of each parameter according to each format is included in advance and decide a value according to a format of a signal that is to be subjected to a frequency transform with reference to the table information. As a result, the control unit 121 can more easily decide a value of each parameter and more easily control processing of the local oscillating unit 106 and the IF signal processing unit 111.

Further, for example, the control unit 121 may acquire a desired IF frequency FIF, a desired RF frequency FRF, and the step size ΔFVCO of the oscillation frequency FVCO of the local oscillating unit 106, and calculate the values of the parameters.

More specifically, based on Equation (5), the frequency variable step size ΔFVCO of the oscillation frequency FVCO of the VCO 27 of the local oscillating unit 106 may be expressed using the frequency variable step size ΔFLO of the LO frequency FLO of the LO signal output from the local oscillating unit 106 and the division ratio M of the dividing unit 28 of the local oscillating unit 106 as in the following Equation (9):

$$\Delta FVCO = M \times \Delta FLO \quad (9)$$

Further, based on Equation (6), ΔFVCO may be expressed using a variable step size ΔN of the division ratio N of the counter 29 of the local oscillating unit 106 and the comparison frequency FREF of the integer-N type PLL of the local oscillating unit 106 as in the following Equation (10):

$$\Delta FVCO = \Delta N \times FREF \quad (10)$$

Based on Equations (9) and (10), in order to change ΔFLO, it is necessary to change any one of the division ratios M, ΔFVCO, and ΔN and the comparison frequency FREF.

Here, since the division ratio M is an integer, it is difficult to cause ΔFLO to have a desired frequency step size by adjusting the value of the division ratio M. Further, since the local oscillating unit 106 is configured with an integer-N type PLL, it is also difficult to use a fraction as the division ratio M. In addition, when the comparison frequency FREF is changed, a characteristic of the PLL changes, and the performance is significantly affected. For this reason, it is also difficult to adjust the value of the comparison frequency FREF.

Therefore, in order to change ΔFLO, it is desirable to change ΔFVCO.

In this regard, the control unit 121 first calculates the desired LO frequency FLO based on an input desired IF frequency FIF and a desired RF frequency FRF using Equation (1). Further, the control unit 121 calculates a desired oscillation frequency FVCO of the VCO 27 of the local oscillating unit 106 based on the desired LO frequency FLO using Equation (5).

Next, the control unit 121 rounds the value of FVCO off using the variable step size ΔFVCO of the input oscillation frequency, and calculates the rounded oscillation frequency FVCO2. Then, the control unit 121 calculates the rounded LO frequency FLO2 based on the rounded oscillation frequency FVCO2 using Equation (5). Further, the control unit 121 calculates the error FLO_ERR of the rounded LO frequency FLO2 on the desired LO frequency FLO.

When the respective parameters are calculated as described above, the control unit 121 controls an operation of the local oscillating unit 106 by supplying the desired LO frequency FLO, the division ratio M, the rounded oscillation frequency FVCO2, and the rounded division ratio N2 to the local oscillating unit 106. According to this control, the local oscillating unit 106 generates the LO signal of the rounded LO frequency FLO, and supplies the generated LO signal to the mixer 105 (LOOUT).

Further, the control unit 121 controls an operation of the IF signal processing unit 111 by supplying the calculated error FLO_ERR to the IF signal processing unit 111. The IF signal processing unit 111 corrects an IF frequency of an IF signal supplied from the IF filter 107 as in Equation (8).

Through this correction, the IF signal of the designated desired IF frequency FIF is obtained. In other words, the control unit 121 can control the operations of the respective components to obtain the IF signal of the desired IF frequency FIF based on input designation (designation of the desired IF frequency FIF, the desired RF frequency FRF, and ΔFVCO). Therefore, the receiving apparatus 100 can more easily implement a high-accuracy frequency transform.

As illustrated in FIG. 4, a single signal processing unit 120 may be configured such that the control unit 121 is added to the configuration of the signal processing unit 110. Of course, the IF filter 107 may be added to the configuration of the signal processing unit 120. Further, the signal processing unit 120 may be configured as a single apparatus (signal processing apparatus) independently of the other configurations.

In this case, the signal processing unit 120 (the signal processing apparatus) can have the same effects as in the receiving apparatus 100.

The correction amount (the error FLO_ERR) can be reduced to be smaller than the band width of the channel selected in the IF filter 107. In other words, the IF signal processing unit 111 can correct even small deviation in the same channel. For example, when the channel width is in a range of from 5 MHz to 6 MHz, whereas the comparison frequency FREF is about 1 MHz, and when the division ratio is 4, the LO frequency is about 250 kHz. Therefore, the error FLO_ERR can be reduced to a small scale.

[1-7. IF Signal Processing Unit]

Figure 5:
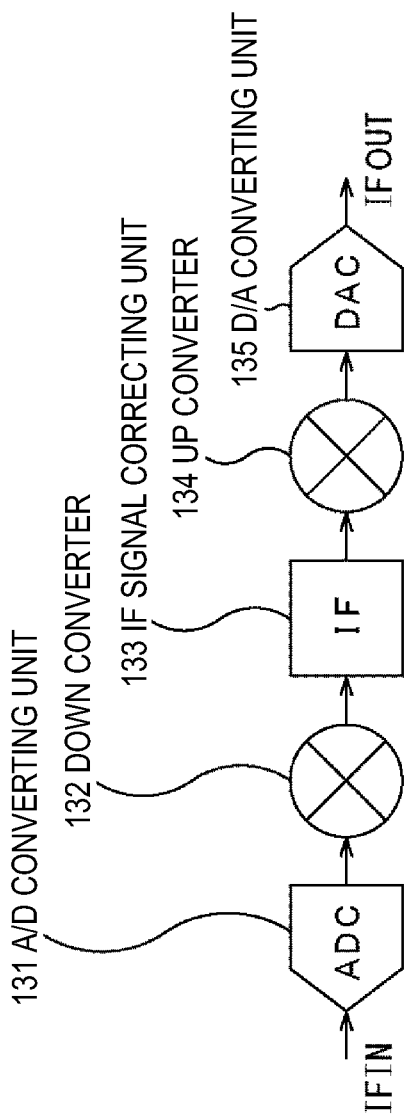
FIG. 5 is a block diagram illustrating a main configuration example of an IF signal processing unit.

FIG. 5 is a block diagram illustrating a main configuration example of the IF signal processing unit 111.

In the example illustrated in FIG. 5, the IF signal processing unit 111 includes an A/D converting unit 131, a down converter 132, an IF signal processing unit 133, an up converter 134, and a D/A converting unit 135.

The A/D converting unit 131 performs A/D conversion on an analog IF signal supplied from the IF filter 107. The A/D converting unit 131 preferably has a sufficiently broad band and high dynamic range in order to allow an IF frequency error by the error FLO_ERR. The A/D converting unit 131 supplies digital data of the IF signal that has been subjected to A/D conversion to the down converter 132.

The down converter 132 down-converts the IF frequency of the digital data of the supplied IF signal. The down converter 132 supplies the digital data of the down-converted IF signal to the IF signal processing unit 133.

The IF signal processing unit 133 performs desired processing on the digital data of the input IF signal. Content of the processing is arbitrary. The IF signal processing unit 133 supplies the digital data of the processed IF signal to the up converter 134.

The up converter 134 up-converts the IF frequency of the digital data of the IF signal supplied from the IF signal processing unit 133. The up converter 134 supplies the digital data of the up-converted IF signal to the D/A converting unit 135.

The D/A converting unit 135 performs D/A conversion on the digital data of the supplied IF signal. The D/A converting unit 135 outputs the analog IF signal that has been subjected to D/A conversion to the outside of the IF signal processing unit 111 (the outside of the receiving apparatus 100).

The error FLO_ERR is subjected to correction (digital correction) in a frequency transform by at least one of the down converter 132 and the up converter 134. In other words, in either or both of down conversion by the down converter 132 and up conversion by the up converter 134, conversion is performed on a part or all of the error FLO_ERR. The error FLO_ERR is corrected at a point in time when supply to the D/A converting unit 135 is made. In other words, a difference between down conversion by the down converter 132 and up conversion by the up converter 134 is the error FLO_ERR.

As a result, the IF signal processing unit 111 can correct the error FLO_ERR using the configuration (the down converter 132 and the up converter 134) for signal processing by the IF signal processing unit 133. In other words, the IF signal processing unit 111 can easily correct the error FLO_ERR.

[1-8. Flow of Receiving Process]

Figure 6:
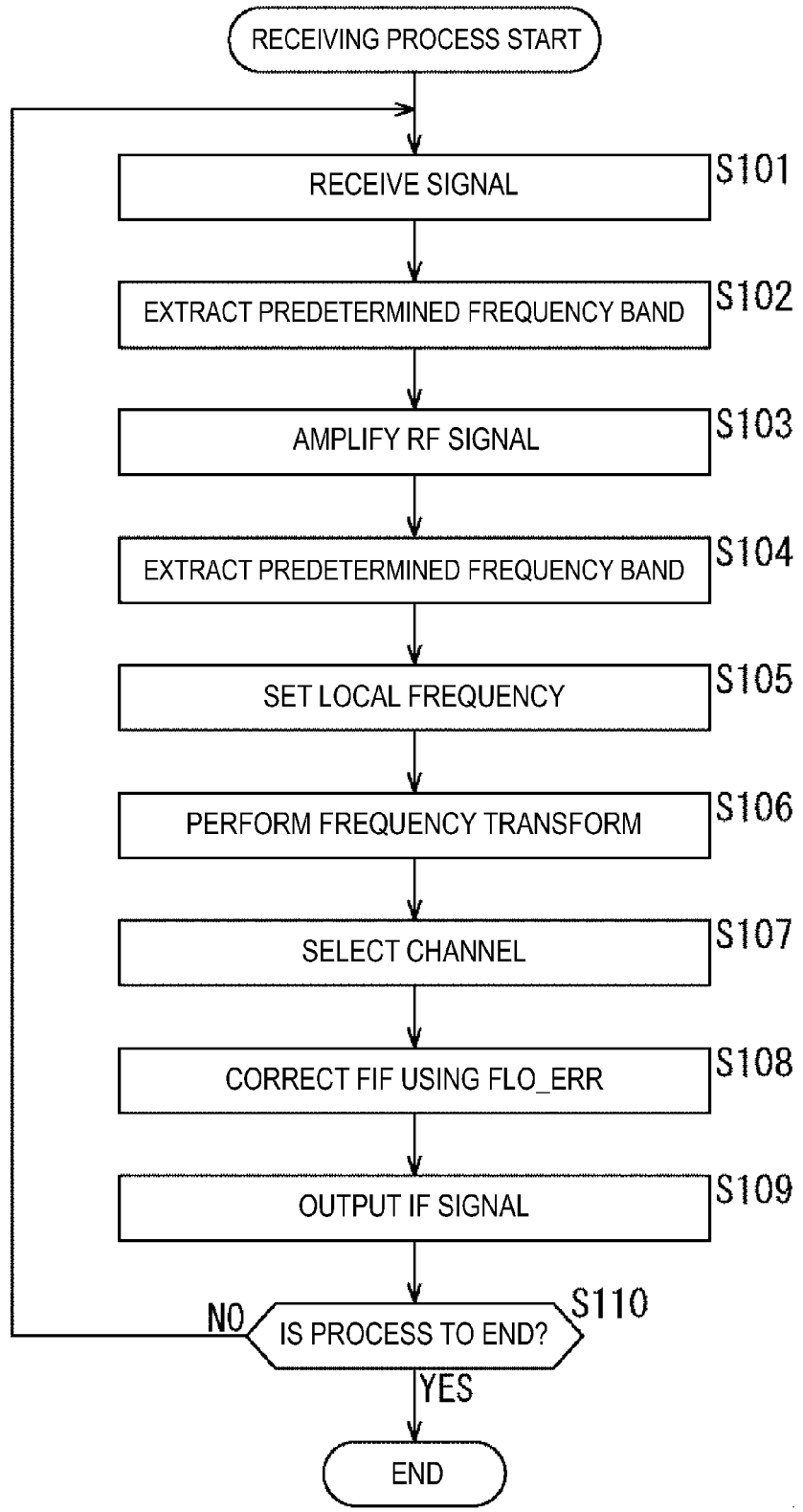
FIG. 6 is a flowchart for describing an example of the flow of a receiving process.

An example of the flow of the receiving process will be described with reference to a flowchart of FIG. 6.

When preparation for receiving a signal is completed, the receiving apparatus 100 starts a receiving process. When the receiving process starts, in step S101, the antenna 101 receives a signal. When supply of a signal has ended and the antenna 101 was not able to receive a signal, the process of steps S102 to S109 is not executed. In this case, the process proceeds to step S110.

In step S102, the RF filter 102 extracts a predetermined frequency band from an RF signal obtained in the process of step S101.

In step S103, the RFVGA 103 amplifies the RF signal of the predetermined frequency band extracted in the process of step S102.

In step S104, the RF filter 104 extracts a predetermined frequency band from the RF signal amplified in the process of step S103.

In step S105, the local oscillating unit 106 performs oscillation at a predetermined oscillation frequency FVCO and sets the LO frequency FLO, for example, according to control of the control unit 121.

In step S106, the mixer 105 performs a frequency transform on the RF signal of the predetermined frequency band extracted in the process of step S104 using the LO frequency FLO set in the process of step S105, and generates an IF signal.

In step S107, the IF filter 107 selects a desired channel of the IF signal obtained in the process of step S106.

In step S108, the IF signal processing unit 111 corrects the error FLO_ERR of the IF frequency FIF of the IF signal on which the channel is selected in the process of step S107, for example, according to control of the control unit 121.

In step S109, the IF signal processing unit 111 outputs the IF signal on which an error of the IF frequency is corrected in the process of step S108 to the outside of the receiving apparatus 100.

In step S110, the receiving apparatus 100 determines whether or not the receiving process is to end. For example, when it is determined that the receiving process is not to end for a certain reason, for example, since supply of a signal does not end, the process returns to step S101. As described above, while a signal is continuously being received, the process of steps S101 to S110 is repeatedly executed.

In step S110, for example, when it is determined that the receiving process is to end, for example, since supply of a signal ends, the receiving process ends.

The receiving apparatus 100 corrects the error FLO_ERR of the IF frequency FIF as described above and thus can more easily implement a high-accuracy frequency transform.

[1-9. Flow of Correction Process]

Next, an example of the flow of a correction process will be described with reference to a flowchart of FIG. 7. The control unit 121 calculates parameters to be supplied to the local oscillating unit 106 and the IF signal processing unit 111 by executing the correction process.

When the correction process starts, in step S131, the control unit 121 receives the desired IF frequency FIF, the desired RF frequency FRF, and the step size $\Delta$FVCO of the oscillation frequency FVCO of the local oscillating unit 106 which are designated from the outside.

In step S132, the control unit 121 calculates the desired LO frequency FLO using the values of the parameters obtained in the process of step S131 (FLO=FRF+FIF).

In step S133, the control unit 121 sets the division ratio M from the use range of the LO frequency FLO and the oscillation frequency FVCO.

In step S134, the control unit 121 calculates a value of the desired oscillation frequency FVCO using the desired LO frequency FLO calculated in the process of step S132 and the division ratio M set in the process of step S133 (FVCO=FLO×M).

In step S135, the control unit 121 rounds the desired oscillation frequency FVCO off by $\Delta$FVCO received in the process of step S131, and obtains the rounded oscillation frequency FVCO2.

In step S136, the control unit 121 calculates the rounded LO frequency FLO2 using the rounded oscillation frequency FVCO2 obtained in the process of step S135 and the division ratio M (FLO2=FVCO2/M).

In step S137, the control unit 121 obtains the rounded division ratio N2 using the rounded oscillation frequency FVCO2 calculated in the process of step S135 and the comparison frequency FREF (N2=FVCO2/FREF).

In step S138, the control unit 121 calculates the error FLO_ERR using the rounded LO frequency FLO2 and the desired LO frequency FLO (FLO_ERR=FLO2−FLO).

In step S139, the control unit 121 supplies the rounded LO frequency FLO2, the division ratio M, the rounded oscillation frequency FVCO2, and the rounded division ratio N2 which are calculated as described above to the local oscillating unit 106.

In step S140, the control unit 121 supplies the error FLO_ERR calculated in the process of step S138 to the IF signal processing unit 111.

When the process of step S140 ends, the correction process ends.

As the correction process is performed as described above, the control unit 121 can correct the error of the IF frequency by controlling the local oscillating unit 106 and the IF signal processing unit 111. As a result, the receiving apparatus 100 can obtain the IF signal of the desired IF frequency FIF.

2. Second Embodiment

[2-1. Receiving Apparatus]

In the above description, in order to change ΔFLO, it is necessary to change ΔFVCO, but as can be seen from Equations (9) and (10), ΔFLO may be changed by changing a step size ΔN of the division ratio N instead of ΔFVCO.

Figure 8:
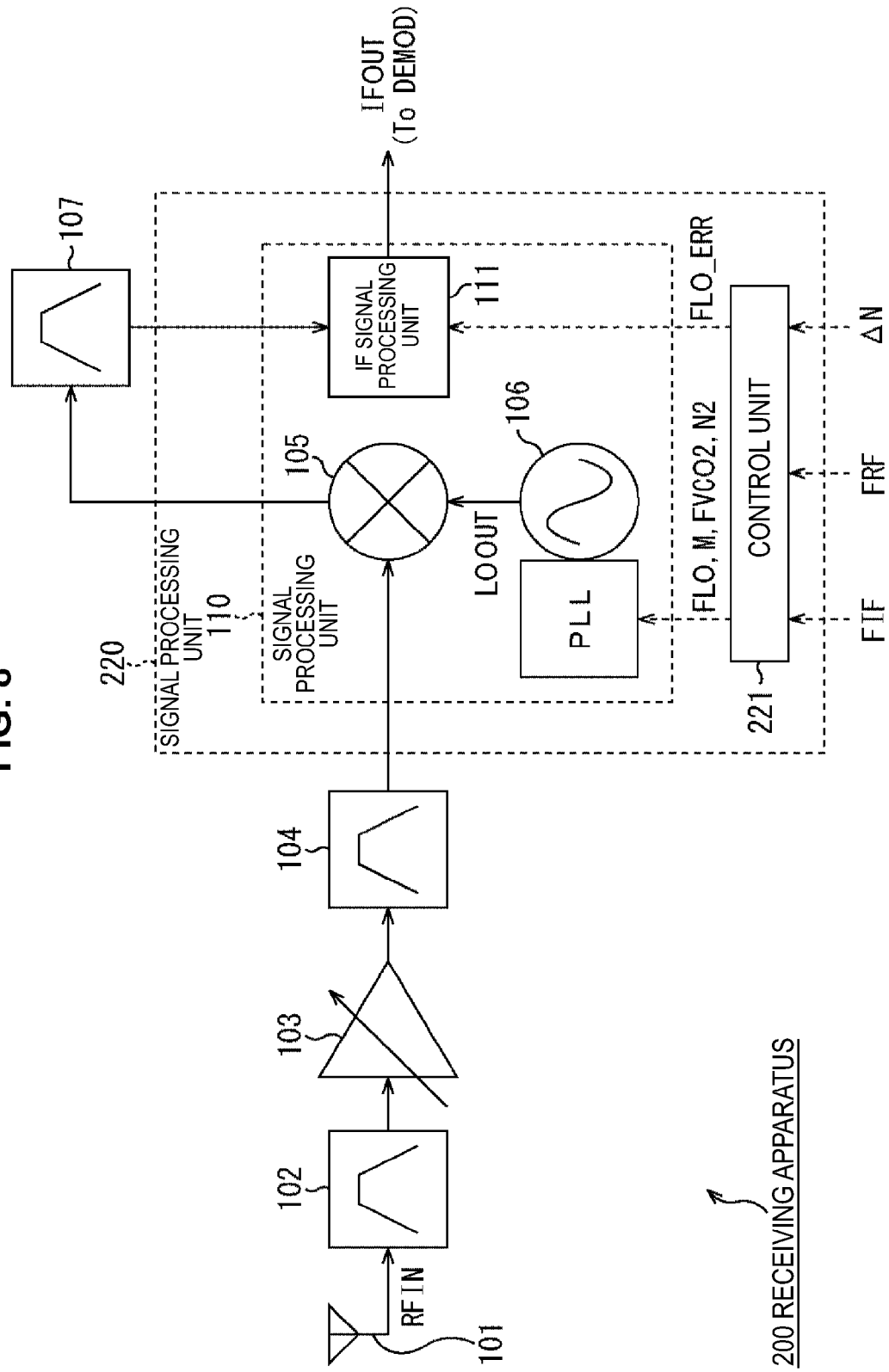
FIG. 8 is a block diagram illustrating a main configuration example of a receiving apparatus.

FIG. 8 is a block diagram illustrating a main configuration example of a receiving apparatus in this case. A receiving apparatus 200 illustrated in FIG. 8 is a receiving apparatus to which the present technology is applied and basically a similar device to the receiving apparatus 100, and thus has a similar configuration and performs a similar process. However, the receiving apparatus 200 includes a control unit 221 instead of the control unit 121 of the receiving apparatus 100.

In other words, the receiving apparatus 200 includes a signal processing unit 220 instead of the signal processing unit 120. In other words, the signal processing unit 220 is basically a processing unit similar to the signal processing unit 120, and thus has a similar configuration and performs a similar process, and includes the control unit 221 instead of the control unit 121. The signal processing unit 220 may be configured as a single apparatus (a signal processing apparatus) independently of the other configurations, similarly to the signal processing unit 120. In this case, the signal processing unit 220 (the signal processing apparatus) can have the same effects as the receiving apparatus 200.

The control unit 221 is basically a processing unit similar to the control unit 121, has a similar configuration, and performs a similar process, but receives ΔN instead of receiving ΔFVCO.

In other words, the control unit 221 acquires the desired IF frequency FIF, the desired RF frequency FRF, and the variable step size ΔN of the division ratio N of the counter 29, and calculates the desired LO frequency FLO, the division ratio M, the rounded oscillation frequency FVCO2, the rounded division ratio N2, and the error FLO_ERR based on the values. The control unit 221 controls an operation of the local oscillating unit 106 by supplying the desired LO frequency FLO, the division ratio M, the rounded oscillation frequency FVCO2, and the rounded division ratio N2 to the local oscillating unit 106. The control unit 221 controls an operation of the IF signal processing unit 111 by supplying the error FLO_ERR to the IF signal processing unit 111.

As a result, similarly to the control unit 121 according to the first embodiment, the control unit 221 can control the local oscillating unit 106 and the IF signal processing unit 111 even using ΔN. Thus, the receiving apparatus 200 can more easily implement a high-accuracy frequency transform, similarly to the receiving apparatus 100.

However, in both the first embodiment in which ΔFVCO is used and the second embodiment in which ΔN is used, it is necessary to calculate the rounded oscillation frequency FVCO2 in order to calculate the rounded LO frequency FLO2. Therefore, the technique described in the first embodiment in which FVCO is rounded off using ΔFVCO may make the process faster.

[2-2. Flow of Correction Process]

The receiving process by the receiving apparatus 200 is performed in the same manner as the receiving process by the receiving apparatus 100. In other words, the description made with reference to the flowchart of FIG. 6 in the first embodiment can be applied as the description of the receiving process by the receiving apparatus 200. Therefore, the description of the receiving process executed by the receiving apparatus 200 will not be made.

Figure 9:
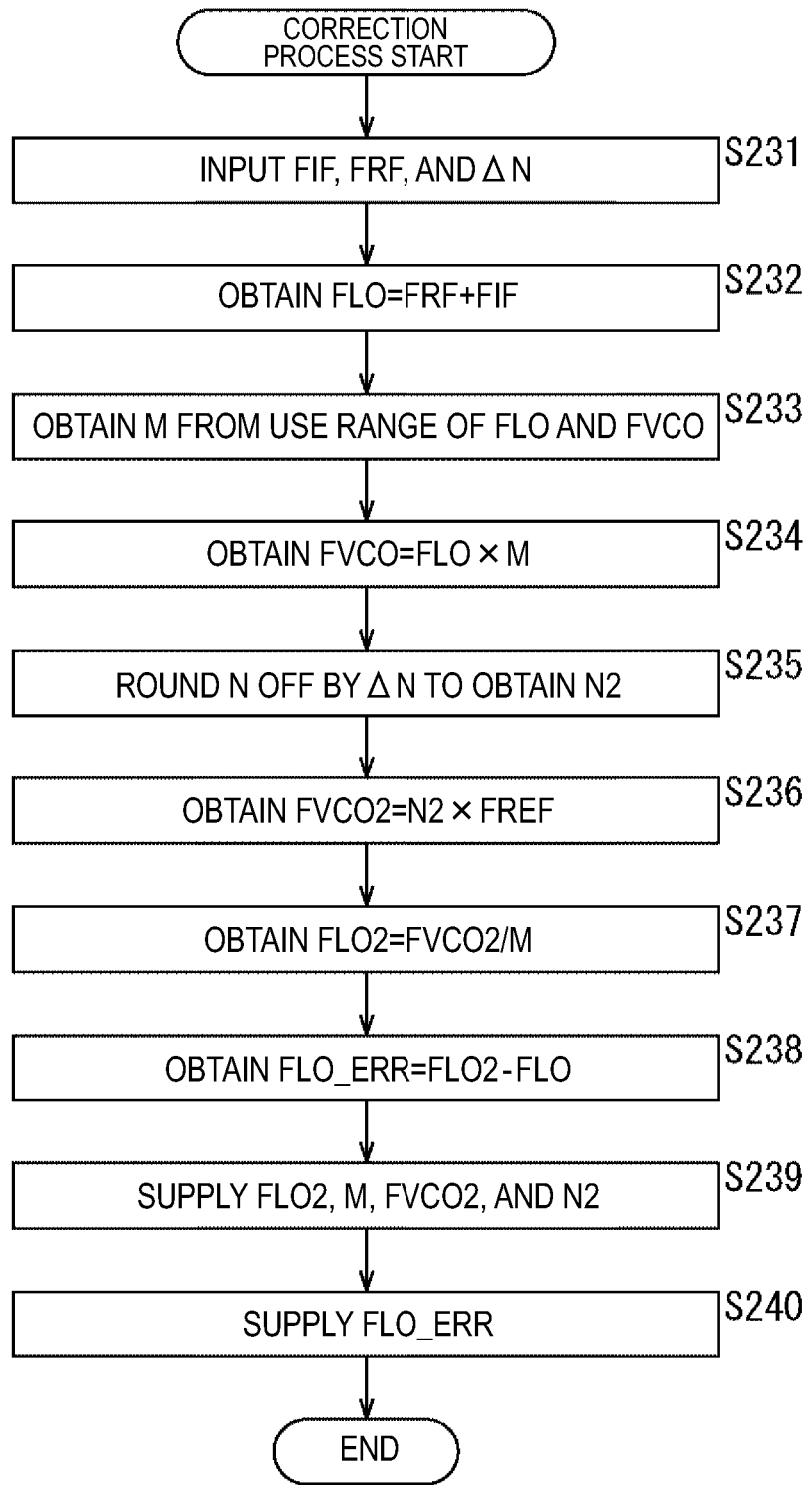
FIG. 9 is a flowchart for describing an example of the flow of a correction process.

An example of the flow of the correction process will be described with reference to a flowchart of FIG. 9. In this case, the correction process is similarly executed in the same manner as basically the same process as the correction process described with reference to the flowchart of FIG. 7 in the first embodiment.

Here, in step S231, the control unit 221 receives the desired IF frequency FIF, the desired RF frequency FRF, and the step size ΔN of the counter 29 of the local oscillating unit 106 which are designated from the outside.

Figure 7:
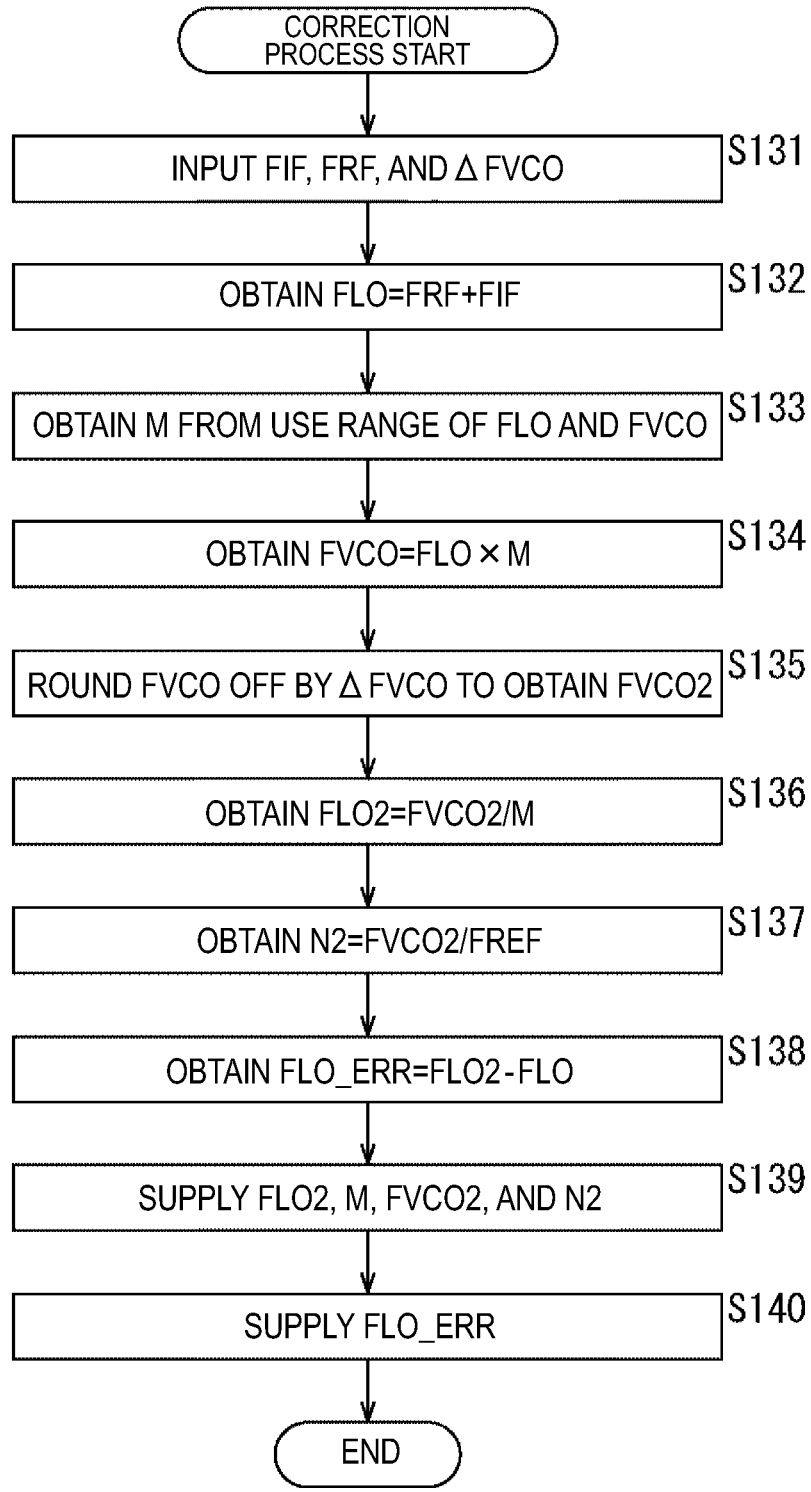
FIG. 7 is a flowchart for describing an example of the flow of a correction process.

The process of steps S232 to S234 is executed in the same manner as in the process of steps S132 to S134 of FIG. 7.

In step S235, the control unit 221 rounds the division ratio N off by ΔN acquired in step S231, and calculates the rounded division ratio N2.

In step S236, the control unit 221 calculates the rounded oscillation frequency FVCO2 using the rounded division ratio N2 calculated in the process of step S235 and the comparison frequency FREF of the integer-N type PLL of the local oscillating unit 106.

The process of step S237 is executed in the same manner as the process of step S136 of FIG. 7.

The process of steps S238 to S240 is executed in the same manner as the process of steps S138 to S140 of FIG. 7.

As the correction process is performed as described above, the control unit 221 can control the local oscillating unit 106 and the IF signal processing unit 111 and correct the error of the IF frequency. As a result, similarly to the receiving apparatus 100, the receiving apparatus 200 can obtain the IF signal of the desired IF frequency FIF. In other words, similarly to the receiving apparatus 100, the receiving apparatus 200 can more easily implement a high-accuracy frequency transform.

3. Third Embodiment

[3-1. Transmitting Apparatus]

Figure 10:
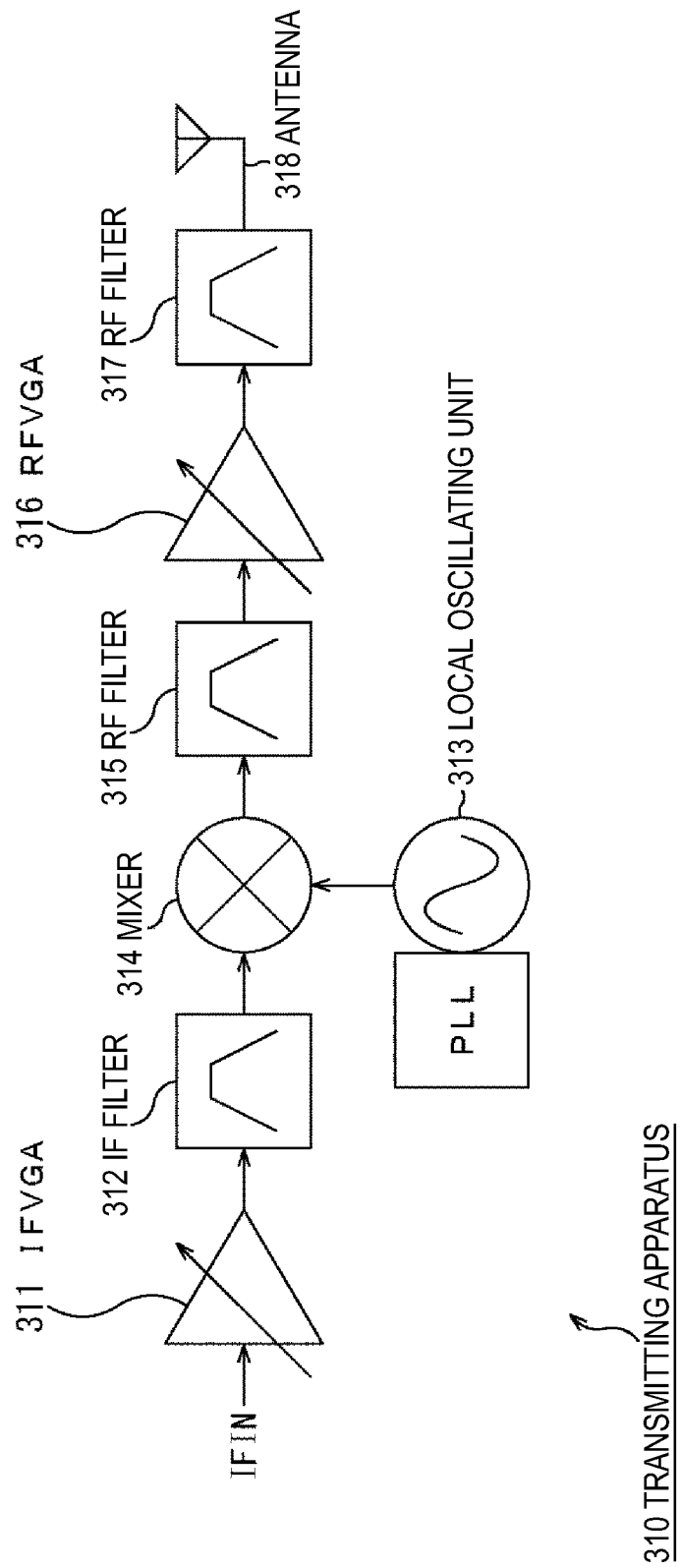
FIG. 10 is a block diagram illustrating a main configuration example of a transmitting apparatus.

The present technology is not limited to a receiving apparatus or a signal processing apparatus and can be applied to a transmitting apparatus. FIG. 10 is a block diagram illustrating a main configuration example of a transmitting apparatus.

A transmitting apparatus 310 illustrated in FIG. 10 is a transmitting apparatus corresponding to the receiving apparatus 10 illustrated in FIG. 1. In other words, the transmitting apparatus 310 is a communication device having a function of performing a frequency transform to transform an IF signal input from the outside into an RF signal and transmitting the RF signal as a radio signal. For example, the radio signal transmitted from the transmitting apparatus 310 is received by the receiving apparatus 10 of FIG. 1.

In other words, in the transmitting apparatus 310, a flow direction of signal processing is reversed to that in the receiving apparatus 10, and the same process as in the receiving apparatus 10 is basically performed.

As illustrated in FIG. 10, the transmitting apparatus 310 includes an IFVGA 311, an IF filter 312, a local oscillating unit 313, a mixer 314, an RF filter 315, an RFVGA 316, an RF filter 317, and an antenna 318.

The IFVGA 311 acquires an IF signal supplied from the outside of the transmitting apparatus 310 (for example, a processing unit of a previous stage such as a demodulation processing unit (DEMOD) that demodulates a modulated IF signal). The IFVGA 311 amplifies the acquired IF signal in order to stabilize a signal level. The IFVGA 311 supplies the amplified IF signal to the IF filter 312.

The IF filter 312 performs a filter process on the IF signal supplied from the IFVGA 311, and extracts a desired frequency band component to select a desired channel. The IF filter 312 supplies the IF signal of the selected channel to the mixer 314.

The local oscillating unit 313 generates a LO signal (clock) of a predetermined frequency (a LO frequency FLO), and supplies the generated LO signal to the mixer 314. The local oscillating unit 313 includes a PLL that outputs a signal of the LO frequency FLO, and supplies a signal generated in the PLL to the mixer 314 as the LO signal.

The mixer 314 converts an IF frequency FIF of the IF signal supplied from the IF filter 312 using the LO frequency FLO of the LO signal supplied from the local oscillating unit 313, and generates an RF signal of an RF frequency FRF. For example, the mixer 314 performs a frequency transform (up conversion) to transform the IF frequency FIF into the RF frequency FRF by multiplying the IF signal by the LO signal. The mixer 314 supplies the generated RF signal to the RF filter 315.

The RF filter 315 performs a filter process on the RF signal supplied from the mixer 314, and extracts a predetermined frequency band component. The RF filter 315 supplies the extracted predetermined frequency band component (RF signal) to the RFVGA 316.

The RFVGA 316 amplifies the RF signal supplied from the RF filter 315 in order to stabilize a signal level. The RFVGA 316 supplies the amplified RF signal to the RF filter 317.

The RF filter 317 is the same filter as the RF filter 315, and performs a filter process on the RF signal supplied from the RFVGA 316 and extracts a predetermined frequency band component. The RF filter 317 supplies the extracted predetermined frequency band component (RF signal) to the antenna 318, and transmits the RF signal through the antenna 318 as the radio signal.

In the transmitting apparatus 310, the same problem as in the receiving apparatus 10 is likely to occur. In other words, when the integer-N type PLL (FIG. 2) having the simple configuration is applied as the local oscillating unit 313, it is likely to be difficult for the transmitting apparatus 310 to reduce ΔFVCO and ΔFLO and to control the oscillation frequency FVCO and the LO frequency FLO with a sufficiently high degree of accuracy (with a sufficiently small step size), similarly to the receiving apparatus 10.

On the other hand, when the fractional-N type PLL (FIG. 3) is applied as the local oscillating unit 313, the configuration of the local oscillating unit 313 is likely to be more complicated. For this reason, the circuit size increases, and thus there are risks of the occupation area increasing, the processing delay increasing, and the power consumption increasing. As a result, it is likely to be difficult to implement a design for downsizing, low power consumption, or the like. Thus, the cost is likely to increase in all aspects such as development, manufacturing, and operation.

[3-2. Frequency Correction in Transmitting Apparatus]

In this regard, in the transmitting apparatus, an error occurring at the IF frequency FIF is corrected using the integer-N type PLL instead of the fractional-N type PLL. In other words, as described above, when the integer-N type PLL is used, the control accuracy of the IF frequency FIF is likely to be lower (larger in the step size) than when the fractional-N type PLL is used, but an error of the IF frequency FIF occurring due to a difference in the accuracy (step size), that is, an error of the LO frequency FLO, is corrected.

Here, in the transmitting apparatus, as described above, the process flow is the opposite of that in the receiving apparatus, and thus correction of the IF frequency is performed before a frequency transform for transforming an IF signal into an RF signal.

For example, provided are an oscillating unit having a division ratio of an integer that performs oscillation at a predetermined oscillation frequency, a correcting unit that corrects a frequency error of an IF signal based on an error of an oscillation frequency of an IF signal, a frequency transforming unit that transforms a frequency of an IF signal on which an error is corrected by the correcting unit using the signal of the oscillation frequency obtained by oscillation of the oscillating unit, and a transmitting unit that transmits the RF signal generated by the frequency transforming unit.

Thus, it is possible to implement a high-accuracy frequency transform while using an oscillating unit of a simple configuration having a division ratio of an integer as a configuration of the transmitting apparatus. In other words, the transmitting apparatus can simplify the configuration while implementing frequency control of high accuracy (small step size). In other words, the transmitting apparatus can more easily perform a high-accuracy frequency transform. Thus, as the transmitting apparatus controls a frequency transform with a high degree of accuracy, an increase in the circuit size, a processing delay, power consumption, or the like can be suppressed. Therefore, the transmitting apparatus can be easily reduced in size and power consumption, and an increase in the cost in all aspects such as development, manufacturing, and operation can be suppressed.

A control unit configured to control at least an oscillation frequency of the oscillating unit and a correction amount of the correcting unit may be further provided. For example, the control unit performs processing related to correction. As a result, an increase in the circuit size for frequency correction can be suppressed, and a high-accuracy frequency transform can be more easily implemented.

All or a part of the present technology may be implemented by software.

[3-3. Transmitting Apparatus]

Figure 11:
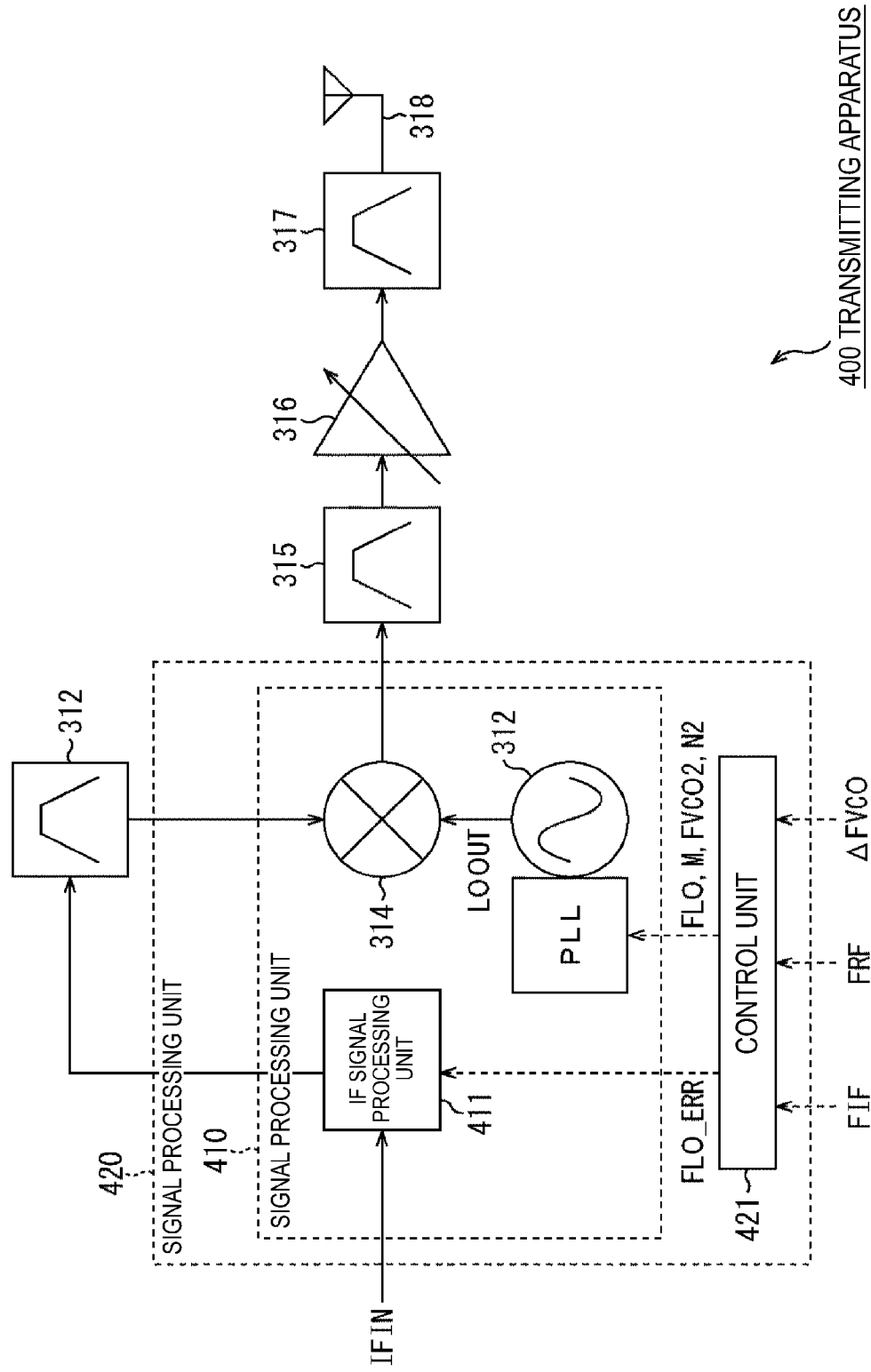
FIG. 11 is a block diagram illustrating a main configuration example of a transmitting apparatus.

A more concrete example will be described below. FIG. 11 is a block diagram illustrating a main configuration example of a transmitting apparatus.

A transmitting apparatus 400 illustrated in FIG. 11 is not only a transmitting apparatus to which the present technology is applied but also a communication device having a transmission function of transmitting a signal input from the outside as a radio signal.

As illustrated in FIG. 11, the transmitting apparatus 400 basically has a configuration similar to the transmitting apparatus 310 (FIG. 10). Further, the transmitting apparatus 400 includes an IF signal processing unit 411 instead of the IFVGA 311 of the transmitting apparatus 310, similarly to the receiving apparatus 100.

The IF signal processing unit 411 is basically the same processing unit as the IF signal processing unit 111, and performs correction of an error occurring due to a frequency transform performed in the mixer 314 of the IF signal supplied from the outside.

In the transmitting apparatus 400, the integer-N type PLL of the simple configuration is applied as the local oscillating unit 313. The integer-N type PLL has the division ratio N of an integer as described above. Therefore, as described above in the first embodiment, it is difficult to sufficiently reduce the control width (step size) ΔFLO of the LO frequency FLO.

Thus, an error is likely to occur at the LO frequency FLO. In other words, in a frequency transform in the mixer 314, the same error FLO_ERR is likely to occur at the IF frequency FIF for the same reason as in a frequency transform in the mixer 105.

In this regard, the IF signal processing unit 411 preferably performs the same correction as in the IF signal processing unit 111 on the IF signal. In other words, when FLO_ERR is already known, the IF signal processing unit 411 can perform this correction without control from the outside (the predetermined frequency FLO_ERR is merely subtracted from the IF frequency FIF). However, the IF signal processing unit 411 performs this correction on the IF signal that is not subjected to a frequency transform by the mixer 314. In other words, correction for an error is performed before an error occurs.

As the IF signal processing unit 411 performs the correction, the transmitting apparatus 400 can obtain an IF signal of a desired IF frequency FIF even when the step size ΔFVCO of the oscillation frequency FVCO of the VCO 27 is not sufficiently small. In other words, even when ΔFLO does not satisfy Equations (3) and (4) (when ΔFRF<ΔFLO), the transmitting apparatus 400 can obtain an IF signal of a desired IF frequency FIF obtained by performing a frequency transform with a sufficiently high degree of accuracy (with a sufficiently small step size).

In other words, the transmitting apparatus 400 can obtain an IF signal of a desired IF frequency FIF by the simple configuration in which the integer-N type PLL is used as the local oscillating unit 313. In other words, the transmitting apparatus 400 can more easily implement a high-accuracy frequency transform.

As a result, as the transmitting apparatus 400 controls a frequency transform with a high degree of accuracy, an increase in the circuit size, a processing delay, power consumption, or the like can be suppressed. Therefore, the transmitting apparatus 400 can be easily reduced in the size and the power consumption, and an increase in the cost in all aspects such as development, manufacturing, and operation can be suppressed.

As illustrated in FIG. 11, the mixer 314, the local oscillating unit 313, and the IF signal processing unit 411 may be configured as a single signal processing unit 410. Of course, the IF filter 312 may be added to the configuration of the signal processing unit 410. The signal processing unit 410 may be configured as a single apparatus (a signal processing apparatus) independently of the other configurations.

In this case, the signal processing unit 410 (the signal processing apparatus) can have the same effects as in the receiving apparatus 400.

Further, when a plurality of values can be a candidate of the error FLO_ERR, it is necessary to decide the error FLO_ERR (that is, a correction amount of the IF frequency FIF) based on certain information. In the example of FIG. 11, the transmitting apparatus 400 includes a control unit 421.

The control unit 421 controls operations of the local oscillating unit 313 and the IF signal processing unit 411. More specifically, the control unit 421 controls the operation of the local oscillating unit 313 by supplying the desired LO frequency FLO, the division ratio M, the rounded oscillation frequency FVCO2, and the rounded division ratio N2 to the local oscillating unit 313. Further, the control unit 421 controls the operation of the IF signal processing unit 411 by supplying the error FLO_ERR to the IF signal processing unit 411.

Further, the control unit 421 decides the values of the parameters. A decision method is arbitrary.

For example, the signal processing unit 410 may be configured to decide the values of the parameters, for example, based on a format of a signal that is to be subjected to a frequency transform (that is, a signal transmitted by the transmitting apparatus 400). For example, the control unit 421 may hold table information in which a value of each parameter according to each format is included in advance and decides a value according to a format of a signal that is to be subjected to a frequency transform with reference to the table information. As a result, the control unit 421 can more easily decide a value of each parameter and control more easily processing of the local oscillating unit 313 and the IF signal processing unit 411.

Further, for example, the control unit 421 may acquire a desired IF frequency FIF, a desired RF frequency FRF, and the step size ΔFVCO of the oscillation frequency FVCO of the local oscillating unit 313, and calculate the values of the parameters.

Referring to Equations (9) and (10), in order to change ΔFLO, it is desirable to change ΔFVCO as described above.

In this regard, the control unit 421 first calculates the desired LO frequency FLO based on an input desired IF frequency FIF and a desired RF frequency FRF using Equation (1). Further, the control unit 421 calculates a desired oscillation frequency FVCO of the VCO 27 of the local oscillating unit 313 based on the desired LO frequency FLO using Equation (5).

Next, the control unit 421 rounds the value of FVCO off using the variable step size ΔFVCO of the input oscillation frequency, and calculates the rounded oscillation frequency FVCO2. Then, the control unit 421 calculates the rounded LO frequency FLO2 based on the rounded oscillation frequency FVCO2 using Equation (5). Further, the control unit 421 calculates the error FLO_ERR of the rounded LO frequency FLO2 on the desired LO frequency FLO.

When the respective parameters are calculated as described above, the control unit 421 controls an operation of the local oscillating unit 313 by supplying the desired LO frequency FLO, the division ratio M, the rounded oscillation frequency FVCO2, and the rounded division ratio N2 to the local oscillating unit 313. According to this control, the local oscillating unit 313 generates the LO signal of the rounded LO frequency FLO, and supplies the generated LO signal to the mixer 314 (LOOUT).

Further, the control unit 421 controls an operation of the IF signal processing unit 411 by supplying the calculated error FLO_ERR to the IF signal processing unit 411. The IF signal processing unit 411 corrects an IF frequency of an IF signal supplied from the outside of the transmitting apparatus 400 as in Equation (8).

Through this correction, an IF signal on which an error occurring in a frequency transform that will be performed later has been corrected is obtained. In other words, the control unit 421 can control the operations of the respective components to obtain the IF signal of the desired IF frequency FIF based on an input designation (designation of the desired IF frequency FIF, the desired RF frequency FRF, and ΔFVCO). Therefore, the transmitting apparatus 400 can more easily implement a high-accuracy frequency transform.

As illustrated in FIG. 11, a single signal processing unit 420 may be configured such that the control unit 421 is added to the configuration of the signal processing unit 410. Of course, the IF filter 312 may be added to the configuration of the signal processing unit 420. Further, the signal processing unit 420 may be configured as a single apparatus (a signal processing apparatus) independently of the other configurations.

In this case, the signal processing unit 420 (the signal processing apparatus) can have the same effects as in the transmitting apparatus 400.

Further, the correction amount (the error FLO_ERR) can be reduced to be smaller than the band width of the channel selected in the IF filter 312, similarly to the first embodiment. In other words, the IF signal processing unit 411 can correct small deviation in the same channel.

Further, the IF signal processing unit 411 may have a similar configuration to the IF signal processing unit 111. In other words, the IF signal processing unit 411 may have the configuration of the example illustrated in FIG. 5.

[3-4. Flow of Transmitting Process]

An example of the flow of a transmitting process will be described with reference to a flowchart of FIG. 12.

When preparation for transmitting a signal is completed, the transmitting apparatus 400 starts a transmitting process. When the transmitting process starts, in step S401, the IF signal processing unit 411 receives an input of an IF signal supplied from the outside of the transmitting apparatus 400. When supply of the IF signal ends, the process of steps S402 to S409 is not executed. In this case, the process proceeds to step S410.

In step S402, the IF signal processing unit 411 corrects the error FLO_ERR of the IF frequency FIF of the IF signal received in the process of step S401, for example, according to control of the control unit 421.

In step S403, the IF filter 312 selects a desired channel of the IF signal on which the IF frequency FIF is corrected in the process of step S402.

In step S404, the local oscillating unit 313 performs oscillation at a predetermined oscillation frequency FVCO and sets a LO frequency FLO, for example, according to control of the control unit 421.

In step S405, the mixer 314 performs a frequency transform on the IF signal on which the channel is selected in the process of step S403 using the LO frequency FLO set in the process of step S404, and generates an RF signal.

In step S406, the RF filter 315 extracted a predetermined frequency band from the RF signal obtained in the process of step S405.

In step S407, the RFVGA 316 amplifies the RF signal of the predetermined frequency band extracted in the process of step S406.

In step S408, the RF filter 317 extracts a predetermined frequency band from the RF signal amplified in the process of step S407.

In step S409, the RF filter 317 supplies the RF signal of the predetermined frequency band extracted in the process of step S408 to the antenna 318, and transmits the RF signal through the antenna 318 as the radio signal.

In step S410, the transmitting apparatus 400 determines whether or not the transmitting process is to end. For example, when it is determined that the transmitting process is not to end for a certain reason, for example, since supply of the IF signal does not end, the process returns to step S401. As described above, while a signal is continuously being transmitted, the process of steps S401 to S410 is repeatedly executed.

When it is determined in step S410 that the transmitting process is to end, for example, since supply of the IF signal ends, the transmitting process ends.

As described above, the transmitting apparatus 400 corrects the error FLO_ERR of the IF frequency FIF, and thus a high-accuracy frequency transform can be more easily implemented.

Further, the control unit 421 performs the correction process in the same manner as the receiving apparatus 100 described with reference to the flowchart of FIG. 7. Therefore, the description thereof will not be repeated.

4. Fourth Embodiment

[4-1. Transmitting Apparatus]

In a transmitting apparatus, similarly to the example of the receiving apparatus, ΔFLO may be changed by changing the step size ΔN of the division ratio N instead of ΔFVCO.

Figure 13:
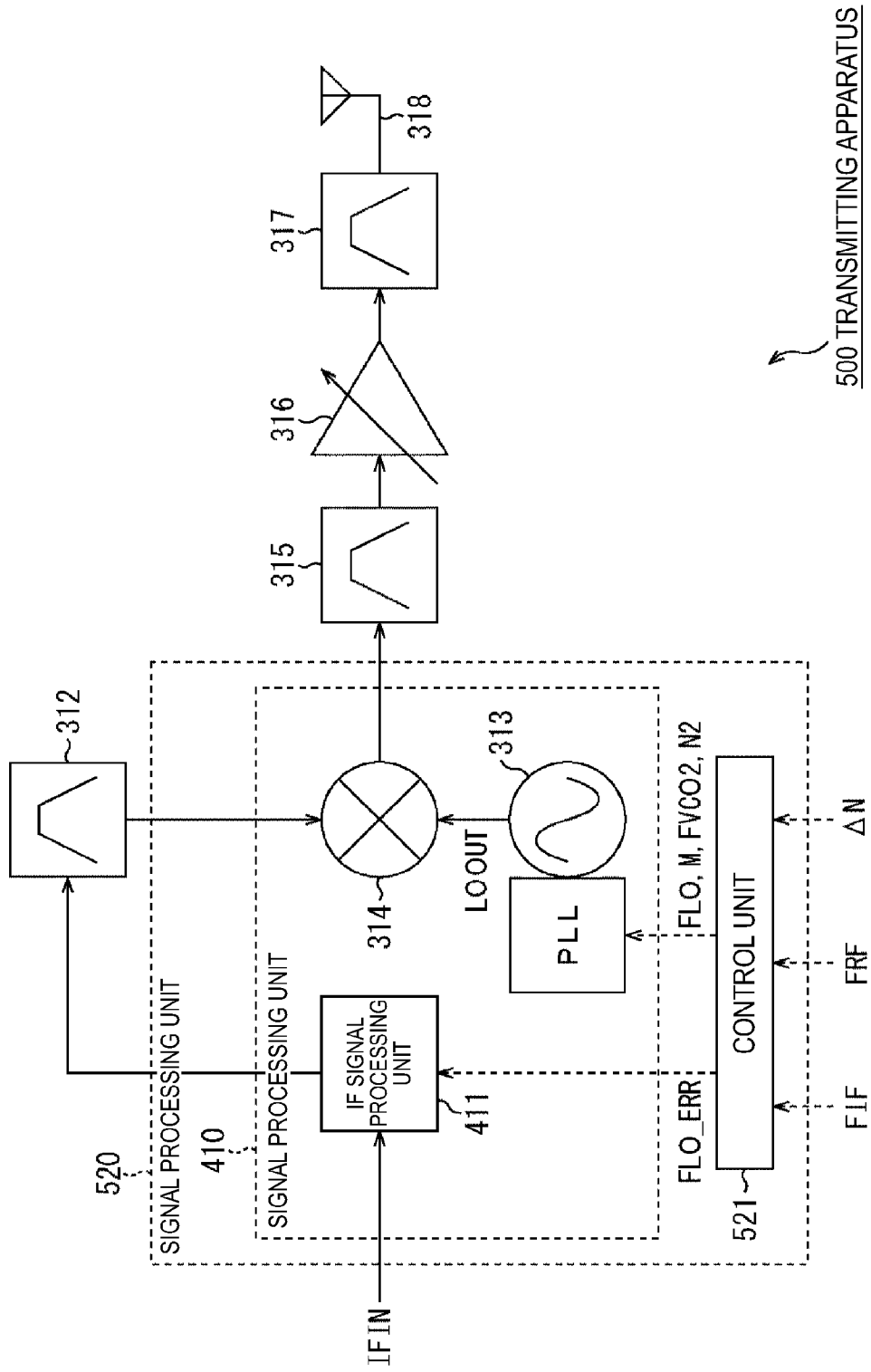
FIG. 13 is a block diagram illustrating a main configuration example of a transmitting apparatus.

FIG. 13 is a block diagram illustrating a main configuration example of a transmitting apparatus in this case. A transmitting apparatus 500 illustrated in FIG. 13 is not only a transmitting apparatus to which the present technology is applied but also an apparatus basically similar to the transmitting apparatus 400, and has a similar configuration and performs a similar process. However, the transmitting apparatus 500 includes a control unit 521 instead of the control unit 421 of the transmitting apparatus 400.

In other words, the transmitting apparatus 500 includes a signal processing unit 520 instead of the signal processing unit 420. In other words, the signal processing unit 520 is basically a processing unit similar to the signal processing unit 420, has a similar configuration, and performs a similar process, but includes the control unit 521 instead of the control unit 421. Similarly to the signal processing unit 420, the signal processing unit 520 may be configured as a single apparatus (a signal processing apparatus) independently of the other configurations. In this case, the signal processing unit 520 (the signal processing apparatus) can have the same effects as in the example of the transmitting apparatus 400.

The control unit 521 is basically a processing unit similar to the control unit 421, has a similar configuration, and performs a similar process, but receives ΔN instead of ΔFVCO.

In other words, the control unit 521 acquires the desired IF frequency FIF, the desired RF frequency FRF, and the variable step size ΔN of the division ratio N of the counter 29, and calculates the desired LO frequency FLO, the division ratio M, the rounded oscillation frequency FVCO2, the rounded division ratio N2, and the error FLO_ERR based on the acquired values. The control unit 521 controls an operation of the local oscillating unit 313 by supplying the desired LO frequency FLO, the division ratio M, the rounded oscillation frequency FVCO2, and the rounded division ratio N2 to the local oscillating unit 313. Further, the control unit 521 controls an operation of the IF signal processing unit 411 by supplying the error FLO_ERR to the IF signal processing unit 411.

As a result, the control unit 521 can control the local oscillating unit 313 and the IF signal processing unit 411 even using ΔN, similarly to the control unit 421 of the third embodiment. Thus, the transmitting apparatus 500 can more easily implement a high-accuracy frequency transform, similarly to the transmitting apparatus 400.

However, in both the third embodiment in which ΔFVCO is used and the fourth embodiment in which ΔN is used, it is necessary to calculate the rounded oscillation frequency FVCO2 in order to calculate the rounded LO frequency FLO2. Therefore, the technique described in the third embodiment in which FVCO is rounded off using ΔFVCO may make the process faster.

Figure 12:
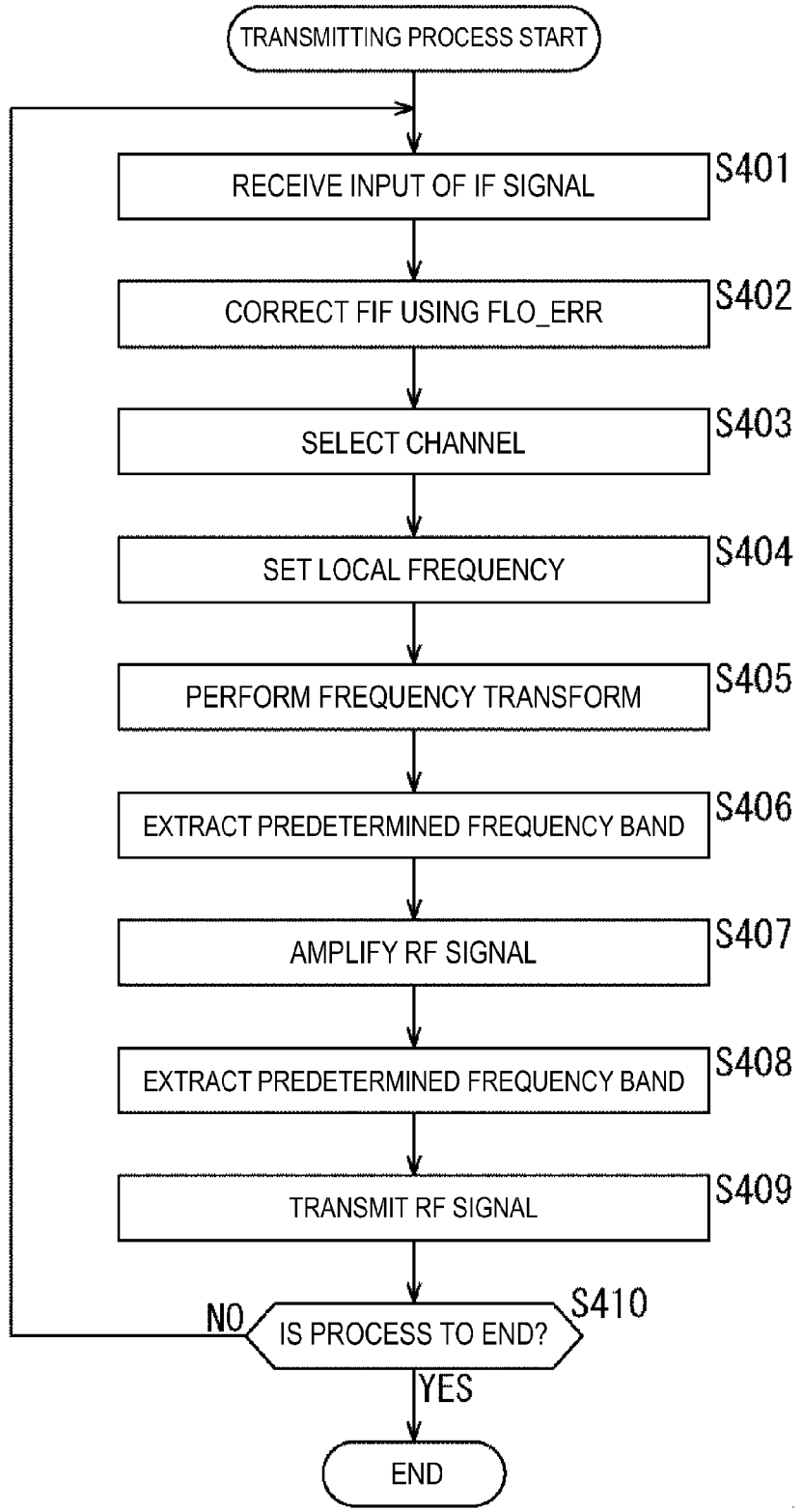
FIG. 12 is a flowchart for describing an example of the flow of a transmitting process.

Further, the transmitting process by the transmitting apparatus 500 is similar to the transmitting process by the transmitting apparatus 400, and the description made with reference to the flowchart of FIG. 12 in the third embodiment can be applied as a description of the transmitting process by the transmitting apparatus 500. Therefore, the description of the transmitting process executed by the transmitting apparatus 500 will not be made.

Further, the control unit 521 performs the correction process in the same manner as the receiving apparatus 200 described with reference to the flowchart of FIG. 9. Therefore, the description thereof will not be repeated.

[Additional Note]

The above description has been made in connection with the example in which each transmitting apparatus and each receiving apparatus transmit and receive a radio signal, but a signal transmission medium in communication performed by the apparatuses is arbitrary. In other words, for example, the present technology can be applied to a transmitting apparatus and a receiving apparatus that perform wired communication. Further, the present technology can be applied to a transmitting apparatus and a receiving apparatus that perform both wireless communication and wired communication.

Further, the present technology can be applied to a transceiving apparatus having a both a transmission function of transmitting a signal and a reception function of receiving a signal. In this case, the present technology can be applied to at least one of the transmission function and the reception function.

In addition, the present technology can be applied to any apparatus having at least a signal processing function of performing a frequency transform described in the above embodiment. For example, the present technology can be applied to another apparatus having at least one of the transmission function and the reception function. A concrete example will be described below.

5. Fifth Embodiment

[Display Device]

Figure 14:
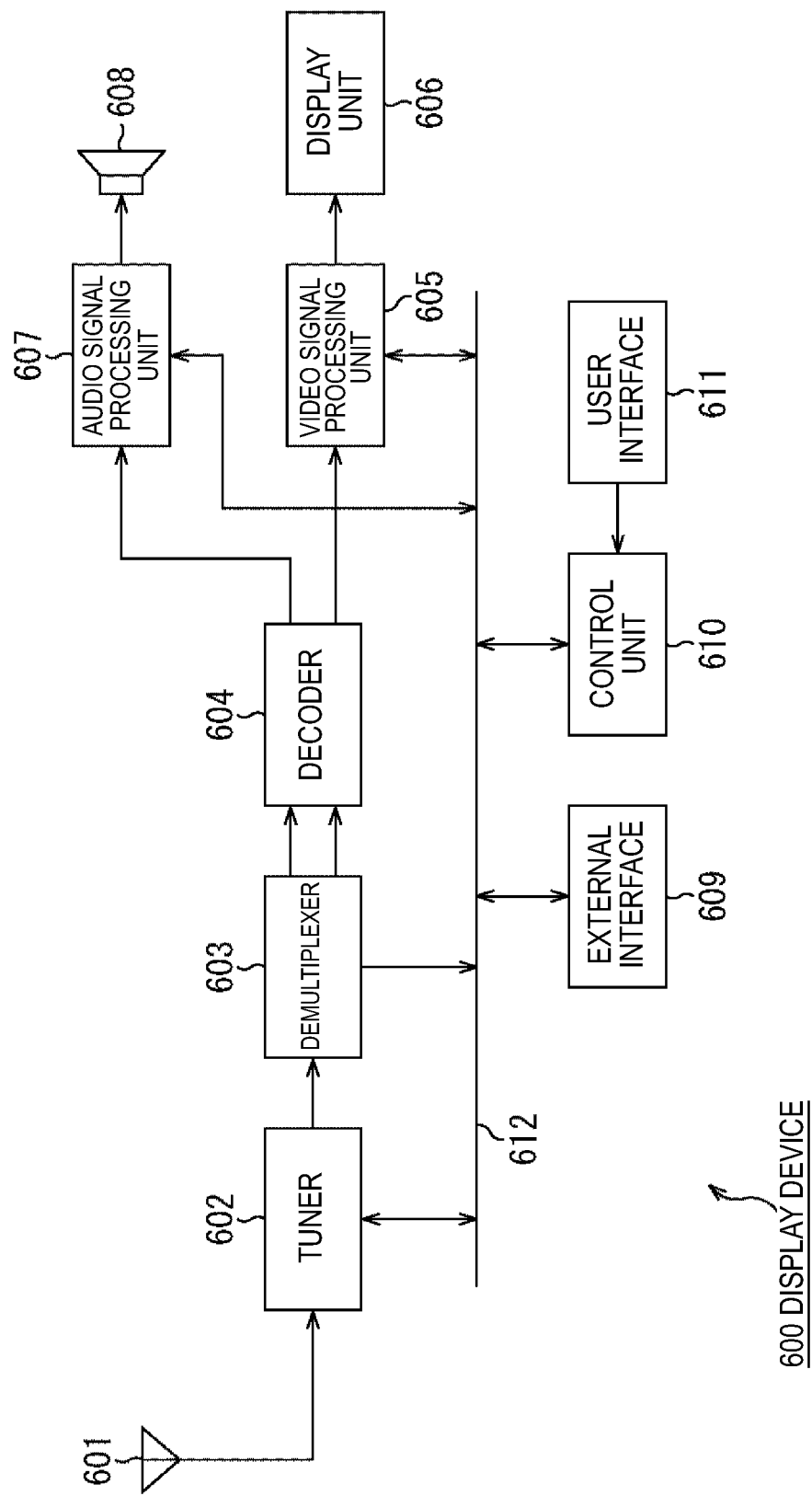
FIG. 14 is a block diagram illustrating a main configuration example of a display device.

FIG. 14 is a block diagram illustrating a main configuration example of a display device using the above-described receiving apparatus (the receiving apparatus 100 or the receiving apparatus 200) as a processing unit. A display device 600 illustrated in FIG. 14 is not only a receiving apparatus that receives a broadcast wave (for example, a television signal) including an image signal but also a device that displays an image corresponding to an image signal included in the received broadcast wave. For example, the display device 600 includes an antenna 601, a tuner 602, a demultiplexer 603, a decoder 604, a video signal processing unit 605, a display unit 606, an audio signal processing unit 607, a speaker 608, an external interface 609, a control unit 610, a user interface 611, and a bus 612.

The tuner 602 extracts a signal of a desired channel from a broadcast signal received through the antenna 601, and demodulates the extracted signal. Then, the tuner 602 outputs an encoded bit stream obtained by demodulation to the demultiplexer 603. In other words, the tuner 602 undertakes a transmitting unit in the display device 600 that receives an encoded stream in which an image is encoded.

The demultiplexer 603 demultiplexer a video stream and an audio stream of a program of a viewing target from the encoded bit stream, and outputs the demultiplexed streams to the decoder 604. Further, the demultiplexer 603 extracts auxiliary data such as an electronic program guide (EPG) from the encoded bit stream, and supplies the extracted data to the control unit 610. The demultiplexer 603 may perform descrambling when the encoded bit stream is scrambled.

The decoder 604 decodes the video stream and the audio stream input from the demultiplexer 603. Then, the decoder 604 outputs video data generated by the decoding process to the video signal processing unit 605. Further, the decoder 604 outputs audio data generated by the decoding process to the audio signal processing unit 607.

The video signal processing unit 605 replays the video data input from the decoder 604, and causes a video to be displayed on the display unit 606. Further, the video signal processing unit 605 may cause an application screen supplied via a network to be displayed on the display unit 606. Further, the video signal processing unit 605 may perform an additional process such as noise reduction on the video data according to a setting. In addition, the video signal processing unit 605 may generate an image of a graphical user interface (GUI) such as a button or a cursor and cause the generated image to overlap an output image.

The display unit 606 is driven by a driving signal supplied from the video signal processing unit 605, and displays a video or an image on a screen of a display device (for example, a liquid crystal display, a plasma display, or an organic electro luminescence display) (organic EL display) (OELD)).

The audio signal processing unit 607 performs a replay process such as D/A conversion and amplification on the audio data input from the decoder 604, and outputs a sound through the speaker 608. Further, the audio signal processing unit 607 may perform an additional process such as noise reduction on the audio data.

The external interface 609 is an interface for connecting the display device 600 with an external device or a network. For example, a video stream or an audio stream received through the external interface 609 may be decoded by the decoder 604. In other words, the external interface 609 also undertakes a transmitting unit in the display device 600 that receives an encoded stream in which an image is encoded.

The control unit 610 includes a processor such as a CPU and a memory such as a RAM and a ROM. The memory stores a program executed by the CPU, program data, EPG data, data acquired via a network, and the like. For example, the program stored by the memory is read and executed by the CPU when the display device 600 is activated. The CPU executes the program and controls an operation of the display device 600, for example, according to an operation signal input from the user interface 611.

The user interface 611 is connected with the control unit 610. For example, the user interface 611 includes a button and a switch for the user to operate the display device 600, a remote control signal receiving unit, and the like. The user interface 611 detects the user's operation made through these components, generates an operation signal, and outputs the generated operation signal to the control unit 610.

The bus 612 connects the tuner 602, the demultiplexer 603, the decoder 604, the video signal processing unit 605, the audio signal processing unit 607, the external interface 609, and the control unit 610 to one another.

The receiving apparatus 100 or the receiving apparatus 200 is used as the antenna 601 and the tuner 602 of the display device 600 having the above-described configuration. Therefore, the display device 600 can more easily implement a high-accuracy frequency transform.

6. Sixth Embodiment

[Communication Device]

Figure 15:
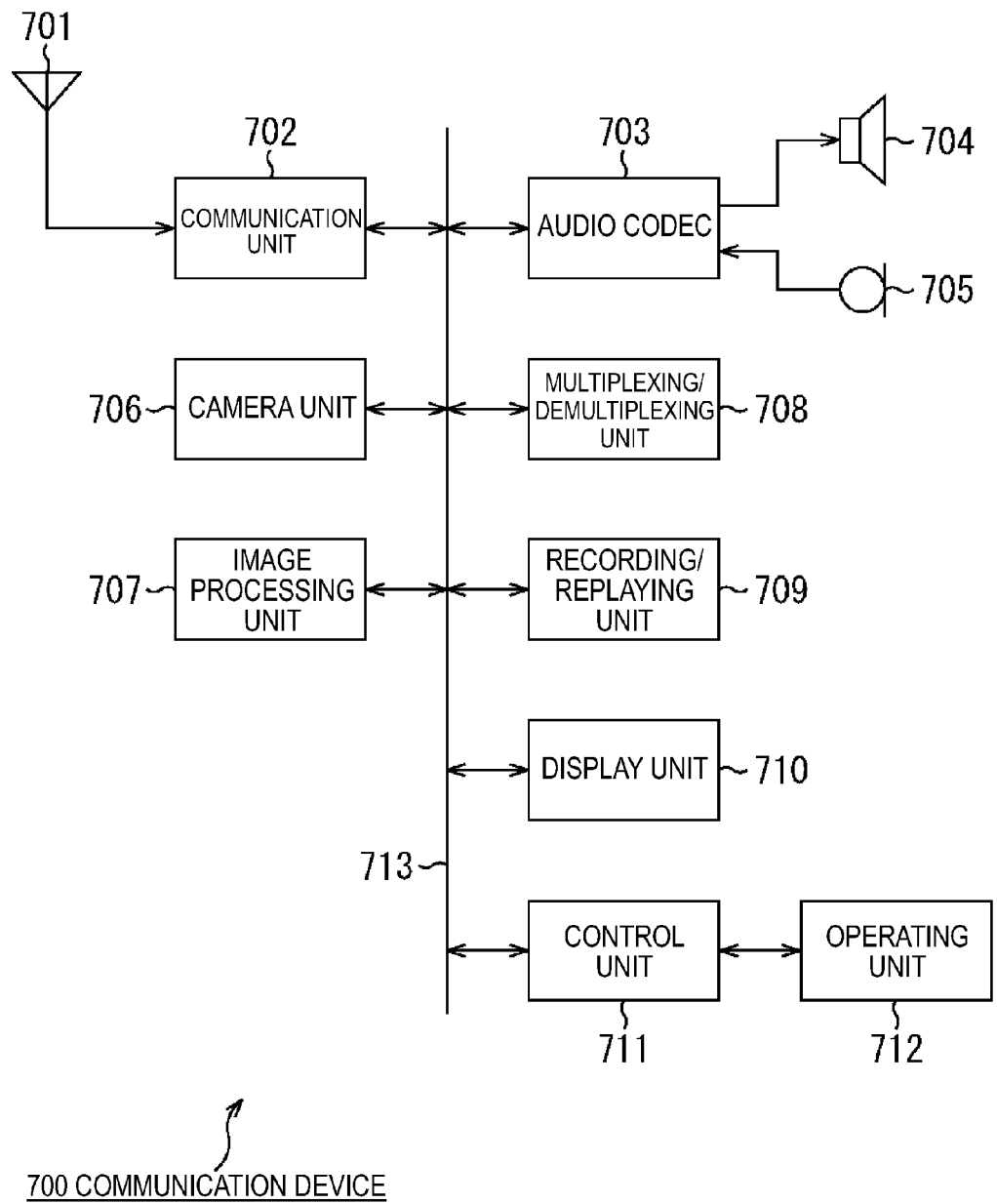
FIG. 15 is a block diagram illustrating a main configuration example of a communication device.

FIG. 15 is an example of a schematic configuration of a communication device to which the above embodiment is applied. A communication device 700 illustrated in FIG. 15 is, for example, a mobile telephone that performs communication related to a call between the user and a communication counterpart, and includes an antenna 701, a communication unit 702, an audio codec 703, a speaker 704, a microphone 705, a camera unit 706, an image processing unit 707, a multiplexing/demultiplexing unit 708, a recording/replaying unit 709, a display unit 710, a control unit 711, an operating unit 712, and a bus 713.

The antenna 701 is connected to the communication unit 702. The speaker 704 and the microphone 705 are connected to the audio codec 703. The operating unit 712 is connected to the control unit 711. The bus 713 connects the communication unit 702, the audio codec 703, the camera unit 706, the image processing unit 707, the multiplexing/demultiplexing unit 708, the recording/replaying unit 709, the display unit 710, and the control unit 711 to one another.

The communication device 700 performs transmission and reception of an audio signal, transmission and reception of electronic mail or image data, shooting of an image, recording of data, and the like in various operation modes including a voice call mode, a data communication mode, a photography mode, and a video telephone mode.

In the voice call mode, an analog audio signal generated by the microphone 705 is supplied to the audio codec 703. The audio codec 703 converts the analog audio signal into audio data, performs A/D conversion on the converted audio data, and compresses the A/D-converted data. Then, the audio codec 703 outputs the compressed audio data to the communication unit 702. The communication unit 702 encodes and modulates the audio data to generate a transmission signal. Then, the communication unit 702 transmits the generated transmission signal to a base station (not shown) through the antenna 701. Further, the communication unit 702 performs amplification and a frequency transform on a radio signal received through the antenna 701 to acquire a reception signal. Then, the communication unit 702 demodulates and decodes the reception signal to generate audio data, and outputs the generated audio data to the audio codec 703. The audio codec 703 decompresses the audio data, performs D/A conversion on the decompressed audio data, and generates an analog audio signal. Then, the audio codec 703 supplies the generated audio signal to the speaker 704, and causes a sound to be output.

In the data communication mode, for example, the control unit 711 generates text data configuring electronic mail according to the user's operation made through the operating unit 712. Further, the control unit 711 causes text to be displayed on the display unit 710. Further, the control unit 711 generates electronic mail data according to a transmission instruction made by the user through the operating unit 712, and outputs the generated electronic mail data to the communication unit 702. The communication unit 702 encodes and modulates the electronic mail data to generate a transmission signal. Then, the communication unit 702 transmits the generated transmission signal to a base station (not shown) through the antenna 701. Further, the communication unit 702 performs amplification and a frequency transform on a radio signal received through the antenna 701 to acquire a reception signal. Then, the communication unit 702 demodulates and decodes the reception signal to restore the electronic mail data, and outputs the restored electronic mail data to the control unit 711. The control unit 711 causes content of the electronic mail to be displayed on the display unit 710, and causes the electronic mail data to be stored in a storage medium of the recording/replaying unit 709.

The recording/replaying unit 709 includes an arbitrary readable/writable storage medium. For example, the storage medium may be a built-in storage medium such as a RAM or a flash memory or may be a removable storage medium such as a hard disk, a magnetic disk, an optical disc, an unallocated space bitmap (USB) memory, or a memory card.

In the shooting mode, for example, the camera unit 706 images a subject to generate image data, and outputs the generated image data to the image processing unit 707. The image processing unit 707 encodes the image data input from the camera unit 706, and causes an encoded stream to be stored in a storage medium of the recording/replaying unit 709.

In the video telephone mode, for example, the multiplexing/demultiplexing unit 708 multiplexes a video stream encoded by the image processing unit 707 and an audio stream input from the audio codec 703, and outputs the multiplexed stream to the communication unit 702. The communication unit 702 encodes and modulates the stream to generate a transmission signal. Then, the communication unit 702 transmits the generated transmission signal to a base station (not shown) through the antenna 701. Further, the communication unit 702 performs amplification and a frequency transform on a radio signal received through the antenna 701 to acquire a reception signal. The transmission signal and the reception signal may include an encoded bit stream. Then, the communication unit 702 demodulates and decodes the reception signal to restore the stream, and outputs the restored stream to the multiplexing/demultiplexing unit 708. The multiplexing/demultiplexing unit 708 demultiplexes a video stream and an audio stream from the input stream, and outputs the video stream and the audio stream to the image processing unit 707 and the audio codec 703, respectively. The image processing unit 707 decodes the video stream to generate video data. The video data is supplied to the display unit 710, and a series of images is displayed through the display unit 710. The audio codec 703 decompresses the audio stream, performs D/A conversion on the decompressed audio stream, and generates an analog audio signal. Then, the audio codec 703 supplies the generated audio signal to the speaker 704 and causes a sound to be output.

In the communication device 700 having the above-described configuration, the communication unit 702 has the function of the receiving apparatus 100 or the receiving apparatus 200 and the function of the transmitting apparatus 400 or the transmitting apparatus 500. Therefore, the communication device 700 can more easily implement a high-accuracy frequency transform.

7. Seventh Embodiment

[Computer]

The series of processes described above can be executed by hardware but can also be executed by software. When the series of processes is executed by software, a program that constructs such software is installed into a computer. Here, the expression "computer" includes a computer in which dedicated hardware is incorporated and a general-purpose personal computer or the like that is capable of executing various functions when various programs are installed.

FIG. 16 is a block diagram showing an example configuration of the hardware of a computer that executes the series of processes described earlier according to a program.

In the computer 800 shown in FIG. 16, a central processing unit (CPU) 801, a read only memory (ROM) 802 and a random access memory (RAM) 803 are mutually connected by a bus 804.

An input/output interface 810 is also connected to the bus 804. An input unit 811, an output unit 812, a storage unit 813, a communication unit 814, and a drive 815 are connected to the input/output interface 810.

The input unit 811 is configured from a keyboard, a mouse, a microphone, a touch panel, an input terminal, or the like. The output unit 812 is configured from a display, a speaker, an input terminal, or the like. The storage unit 813 is configured from a hard disk, a RAM disk, a non-volatile memory, or the like. The communication unit 814 is configured from a network interface or the like. The drive 815 drives a removable media 821 such as a magnetic disk, an optical disk, a magneto-optical disk, a semiconductor memory or the like.

In the computer configured as described above, the CPU 801 loads a program that is stored, for example, in the storage unit 813 onto the RAM 803 via the input/output interface 810 and the bus 804, and executes the program. Thus, the above-described series of processing is performed. The RAM 803 stores data in a suitable manner, which is necessary for the CPU 801 to execute various processing.

Programs to be executed by the computer (the CPU 801) can be provided being recorded in the removable media 821 which is a packaged media or the like. Also, programs may be provided via a wired or wireless transmission medium, such as a local area network, the Internet or digital satellite broadcasting.

In the computer, by loading the removable medium 821 into the drive 815, the program can be installed into the storage unit 813 via the input/output interface 810. It is also possible to receive the program from a wired or wireless transfer medium using the communication unit 814 and install the program into the storage unit 813. As another alternative, the program can be installed in advance into the ROM 802 or the storage unit 813.

It should be noted that the program executed by a computer may be a program that is processed in time series according to the sequence described in this specification or a program that is processed in parallel or at necessary timing such as upon calling.

It should be also noted that, in this specification, the steps describing the program stored in the recording medium include not only a process performed in time series according to the sequence shown therein but also a process executed in parallel or individually, not necessarily performed in time series.

Further, in the present disclosure, a system has the meaning of a set of a plurality of configured elements (such as an apparatus or a module (part)), and does not take into account whether or not all the configured elements are in the same casing. Therefore, the system may be either a plurality of apparatuses, stored in separate casings and connected through a network, or a plurality of modules within a single casing.

Further, an element described as a single device (or processing unit) above may be configured to be divided as a plurality of devices (or processing units). On the contrary, elements described as a plurality of devices (or processing units) above may be configured collectively as a single device (or processing unit). Further, an element other than those described above may be added to each device (or processing unit). Furthermore, a part of an element of a given device (or processing unit) may be included in an element of another device (or another processing unit) as long as the configuration or operation of the system as a whole is substantially the same.

It should be understood by those skilled in the art that various modifications, combinations, sub-combinations and alterations may occur depending on design requirements and other factors insofar as they are within the scope of the appended claims or the equivalents thereof.

For example, the present disclosure can adopt a configuration of cloud computing which processes by allocating and connecting one function by a plurality of apparatuses through a network.

Further, each step described by the above mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

Additionally, the present technology may also be configured as below.

(1)
A signal processing apparatus, including:
an oscillating unit having a division ratio of an integer that performs oscillation at a predetermined oscillation frequency;
a frequency transforming unit that transforms a frequency of a signal of a processing target using a signal of the oscillation frequency obtained by the oscillation of the oscillating unit; and
a correcting unit that corrects an error of the frequency of the signal of the processing target transformed by the frequency transforming unit based on an error of the oscillation frequency.

(2)
The signal processing apparatus according to (1),
wherein the correcting unit corrects the error of the frequency of the signal of the processing target that has been subjected to a frequency transform by the frequency transforming unit.

(3)
The signal processing apparatus according to (2), further including
a channel selecting unit that selects a channel of the signal of the processing target that has been subjected to the frequency transform by the frequency transforming unit,
wherein the correcting unit corrects the error of the frequency of the signal of the processing target of the channel selected by the channel selecting unit.

(4)
The signal processing apparatus according to any one of (1) to (3),
wherein the correcting unit corrects the error of the frequency of the signal of the processing target that is not subjected to a frequency transform by the frequency transforming unit.

(5)
The signal processing apparatus according to (4), further including
a channel selecting unit that selects a channel of the signal of the processing target that is not subjected to a frequency transform by the frequency transforming unit, wherein the correcting unit corrects the error of the frequency of the signal of the processing target before the channel is selected by the channel selecting unit.

(6)
The signal processing apparatus according to any one of (1) to (5),
wherein the error of the oscillation frequency is a difference between a desired value and an actual value of the oscillation frequency that occurs due to a control width of the oscillation frequency.

(7)
The signal processing apparatus according to any one of (1) to (6),
wherein the error of the frequency after the signal of the processing target is transformed is smaller than a control width of the oscillation frequency.

(8)
The signal processing apparatus according to any one of (1) to (7),
wherein a control width of the oscillation frequency is smaller than a channel width of the signal of the processing target.

(9)
The signal processing apparatus according to any one of (1) to (8), further including
a control unit that controls operations of the oscillating unit and the correcting unit.

(10)
The signal processing apparatus according to (9),
wherein the control unit controls at least the oscillation frequency of the oscillating unit and a correction amount of the correcting unit.

(11)
The signal processing apparatus according to (10),
wherein the control unit informs the correcting unit of the correction amount according to a format of the signal of the processing target.

(12)
The signal processing apparatus according to (10) or (11),
wherein the oscillating unit includes
a voltage controlled oscillating unit that controls an output frequency according to an input voltage,
a dividing unit that divides the output frequency of the voltage controlled oscillating unit at a division ratio of an integer, and
a phase comparing unit that converts a phase difference between an input signal of the oscillating unit and an output signal of the dividing unit into a voltage, and supplies the voltage to the voltage controlled oscillating unit,
wherein the voltage controlled oscillating unit controls a frequency of the output signal of the oscillating unit based on the output voltage of the phase comparing unit, and
wherein the control unit calculates the correction amount based on a step size of the output frequency of the voltage controlled oscillating unit and informs the correcting unit of the calculated correction amount.

(13)
The signal processing apparatus according to any one of (10) to (12),
wherein the oscillating unit includes
a voltage controlled oscillating unit that controls an output frequency according to an input voltage,
a dividing unit that divides the output frequency of the voltage controlled oscillating unit at a division ratio of an integer, and
a phase comparing unit that converts a phase difference between an input signal of the oscillating unit and an output signal of the dividing unit into a voltage, and supplies the voltage to the voltage controlled oscillating unit,
wherein the voltage controlled oscillating unit controls a frequency of the output signal of the oscillating unit based on the output voltage of the phase comparing unit, and
wherein the control unit calculates the correction amount based on a step size of the division ratio of the dividing unit and informs the correcting unit of the calculated correction amount.

(14)
A signal processing method performed by a signal processing apparatus, the signal processing method including:
performing oscillation at a predetermined oscillation frequency using a division ratio of an integer;
transforming a frequency of a signal of a processing target using a signal of the oscillation frequency obtained by the oscillation; and
correcting an error of the frequency of the signal of the processing target transformed by a frequency transform based on an error of the oscillation frequency.

(15)
A receiving apparatus, including:
a receiving unit that receives a signal;
an oscillating unit having a division ratio of an integer that performs oscillation at a predetermined oscillation frequency;
a frequency transforming unit that transforms a frequency of an RF signal of the signal received by the receiving unit using a signal of the oscillation frequency obtained by the oscillation of the oscillating unit, and generates an IF signal; and
a correcting unit that corrects an error of a frequency of the IF signal based on an error of the oscillation frequency of the IF signal generated by the frequency transforming unit.

(16)
The receiving apparatus according to (15), further including
a control unit that controls at least the oscillation frequency of the oscillating unit and a correction amount of the correcting unit.

(17)
A receiving method performed by a receiving apparatus, the receiving method including:
receiving a signal;
performing oscillation at a predetermined oscillation frequency using a division ratio of an integer;
converting a frequency of an RF signal of the received signal using a signal of the oscillation frequency obtained by the oscillation, and generating an IF signal; and
correcting an error of a frequency of the IF signal based on an error of the oscillation frequency of the generated IF signal.

(18)
A transmitting apparatus, including:
an oscillating unit having a division ratio of an integer that performs oscillation at a predetermined oscillation frequency;
a correcting unit that corrects an error of a frequency of an IF signal based on an error of the oscillation frequency of the IF signal;
a frequency transforming unit that transforms a frequency of the IF signal of which the error is corrected by the correcting unit using a signal of the oscillation frequency obtained by the oscillation of the oscillating unit, and generates an RF signal; and a transmitting unit that transmits the RF signal generated by the frequency transforming unit.

(19)
The transmitting apparatus according to (18), further including a control unit that controls at least the oscillation frequency of the oscillating unit and a correction amount of the correcting unit.

(20)
A transmitting method performed by a transmitting apparatus, the transmitting method including:

performing oscillation at a predetermined oscillation frequency using a division ratio of an integer;

correcting an error of a frequency of an IF signal based on an error of the oscillation frequency of the IF signal;

transforming a frequency of the IF signal of which the error is corrected using a signal of the oscillation frequency obtained by the oscillation, and generating an RF signal; and transmitting the generated RF signal.

The present disclosure contains subject matter related to that disclosed in Japanese Priority Patent Application JP 2012-156459 filed in the Japan Patent Office on Jul. 12, 2012, the entire content of which is hereby incorporated by reference.

What is claimed is:

1. A signal processing apparatus, comprising:
an oscillating unit having a division ratio of an integer that performs oscillation at a predetermined oscillation frequency;
a frequency transforming unit that transforms a frequency of a signal of a processing target using a signal of the oscillation frequency obtained by the oscillation of the oscillating unit;
a correcting unit that corrects an error of the frequency of the signal of the processing target transformed by the frequency transforming unit based on an error of the oscillation frequency; and
a channel selecting unit that selects a channel of the signal of the processing target that has been subjected to the frequency transform by the frequency transforming unit,
wherein the correcting unit corrects the error of the frequency of the signal of the processing target of the channel selected by the channel selecting unit.

2. The signal processing apparatus according to claim 1, wherein the correcting unit corrects the error of the frequency of the signal of the processing target that has been subjected to a frequency transform by the frequency transforming unit.

3. The signal processing apparatus according to claim 1, wherein the error of the oscillation frequency is a difference between a desired value and an actual value of the oscillation frequency that occurs due to a control width of the oscillation frequency.

4. The signal processing apparatus according to claim 1, wherein the error of the frequency after the signal of the processing target is transformed is smaller than a control width of the oscillation frequency.

5. The signal processing apparatus according to claim 1, wherein a control width of the oscillation frequency is smaller than a channel width of the signal of the processing target.

6. A signal processing apparatus, comprising:
an oscillating unit having a division ratio of an integer that performs oscillation at a predetermined oscillation frequency;
a frequency transforming unit that transforms a frequency of a signal of a processing target using a signal of the oscillation frequency obtained by the oscillation of the oscillating unit;
a correcting unit that corrects an error of the frequency of the signal of the processing target transformed by the frequency transforming unit based on an error of the oscillation frequency; and
a channel selecting unit that selects a channel of the signal of the processing target that is not subjected to a frequency transform by the frequency transforming unit,
wherein the correcting unit corrects the error of the frequency of the signal of the processing target that is not subjected to a frequency transform by the frequency transforming unit, and
wherein the correcting unit corrects the error of the frequency of the signal of the processing target before the channel is selected by the channel selecting unit.

7. A signal processing apparatus, comprising:
an oscillating unit having a division ratio of an integer that performs oscillation at a predetermined oscillation frequency;
a frequency transforming unit that transforms a frequency of a signal of a processing target using a signal of the oscillation frequency obtained by the oscillation of the oscillating unit; and
a correcting unit that corrects an error of the frequency of the signal of the processing target transformed by the frequency transforming unit based on an error of the oscillation frequency; and
a control unit that controls operations of the oscillating unit and the correcting unit,
wherein the control unit controls at least the oscillation frequency of the oscillating unit and a correction amount of the correcting unit,
wherein the control unit informs the correcting unit of the correction amount according to a format of the signal of the processing target, and
wherein the oscillating unit includes
a voltage controlled oscillating unit that controls an output frequency according to an input voltage,
a dividing unit that divides the output frequency of the voltage controlled oscillating unit at a division ratio of an integer, and
a phase comparing unit that converts a phase difference between an input signal of the oscillating unit and an output signal of the dividing unit into a voltage, and supplies the voltage to the voltage controlled oscillating unit,
wherein the voltage controlled oscillating unit controls a frequency of the output signal of the oscillating unit based on the output voltage of the phase comparing unit, and
wherein the control unit calculates the correction amount based on a step size of the output frequency of the voltage controlled oscillating unit and informs the correcting unit of the calculated correction amount.

8. A signal processing apparatus, comprising:
an oscillating unit having a division ratio of an integer that performs oscillation at a predetermined oscillation frequency;

a frequency transforming unit that transforms a frequency of a signal of a processing target using a signal of the oscillation frequency obtained by the oscillation of the oscillating unit; and a correcting unit that corrects an error of the frequency of the signal of the processing target transformed by the frequency transforming unit based on an error of the oscillation frequency; and a control unit that controls operations of the oscillating unit and the correcting unit, wherein the control unit controls at least the oscillation frequency of the oscillating unit and a correction amount of the correcting unit, wherein the control unit informs the correcting unit of the correction amount according to a format of the signal of the processing target, and wherein the oscillating unit includes a voltage controlled oscillating unit that controls an output frequency according to an input voltage, a dividing unit that divides the output frequency of the voltage controlled oscillating unit at a division ratio of an integer, and a phase comparing unit that converts a phase difference between an input signal of the oscillating unit and an output signal of the dividing unit into a voltage, and supplies the voltage to the voltage controlled oscillating unit, wherein the voltage controlled oscillating unit controls a frequency of the output signal of the oscillating unit based on the output voltage of the phase comparing unit, and wherein the control unit calculates the correction amount based on a step size of the division ratio of the dividing unit and informs the correcting unit of the calculated correction amount.

* * * * *